(12) United States Patent
Kakizaki et al.

(10) Patent No.: US 8,989,225 B2
(45) Date of Patent: Mar. 24, 2015

(54) LASER APPARATUS

(75) Inventors: Kouji Kakizaki, Tochigi (JP); Shinji Okazaki, Tochigi (JP); Osamu Wakabayashi, Kanagawa (JP); Takashi Onose, Tochigi (JP); Shinichi Matsumoto, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 130 days.

(21) Appl. No.: 13/590,558

(22) Filed: Aug. 21, 2012

(65) Prior Publication Data

US 2013/0215916 A1 Aug. 22, 2013

(30) Foreign Application Priority Data

Aug. 24, 2011 (JP) ................................ 2011-182722
Jul. 3, 2012 (JP) ................................ 2012-149633

(51) Int. Cl.
*H01S 3/10* (2006.01)
*H01S 5/06* (2006.01)
(Continued)

(52) U.S. Cl.
CPC ................. *H01S 3/10* (2013.01); *H01S 5/0604* (2013.01); *H01S 3/10092* (2013.01); *H01S 3/2251* (2013.01); *H01S 3/2375* (2013.01); *H01S 5/0092* (2013.01); *H01S 5/4087* (2013.01); *H01S 3/08004* (2013.01); *H01S 3/1055* (2013.01); *H01S 3/106* (2013.01); *H01S 3/225* (2013.01); *H01S 3/2325* (2013.01); *H01S 3/235* (2013.01); *H01S 5/06216* (2013.01); *H01S 5/4012* (2013.01); *H01S 3/005* (2013.01); *H01S 3/08086* (2013.01); *H01S 3/1625* (2013.01)

USPC ............... 372/21; 372/23; 372/25; 372/29.01; 372/29.013; 372/55; 372/57

(58) Field of Classification Search
CPC ..... H01S 3/10; H01S 3/10092; H01S 3/2251; H01S 3/2375; H01S 5/0092; H01S 5/0604; H01S 5/4087; H01S 3/005; H01S 3/08004; H01S 3/08086; H01S 3/1055; H01S 3/106; H01S 3/1625; H01S 3/225; H01S 3/2325; H01S 3/235; H01S 5/06216; H01S 5/06; H01S 5/4012
USPC ............ 372/21, 23, 25, 29.01, 29.013, 55–65
See application file for complete search history.

(56) References Cited

U.S. PATENT DOCUMENTS 5,081,635 A * 1/1992 Wakabayashi et al. ......... 372/57
7,088,758 B2 8/2006 Sandstrom et al.
(Continued)

FOREIGN PATENT DOCUMENTS

JP 2006-269628 10/2006

OTHER PUBLICATIONS

JP2003-124554 (English Translation).*

*Primary Examiner* — Colleen A Matthews
*Assistant Examiner* — Delma R Forde
(74) *Attorney, Agent, or Firm* — Hogan Lovells US LLP

(57) ABSTRACT

A laser apparatus includes a master oscillator capable of outputting a laser beam having a spectrum that includes at least three wavelength peaks, a multi-wavelength oscillation control mechanism capable of controlling energy of each of the wavelength peaks, a spectrum detecting unit that detects the spectrum of the above-mentioned laser beam, and a controller that controls the multi-wavelength oscillation control mechanism based on a detection result detected by the spectrum detecting unit.

23 Claims, 39 Drawing Sheets

(51) Int. Cl.
*H01S 3/225* (2006.01)
*H01S 3/23* (2006.01)
*H01S 5/00* (2006.01)
*H01S 5/40* (2006.01)
*H01S 3/08* (2006.01)
*H01S 3/1055* (2006.01)
*H01S 3/106* (2006.01)
*H01S 5/062* (2006.01)
*H01S 3/00* (2006.01)
*H01S 3/16* (2006.01)

(56) References Cited

U.S. PATENT DOCUMENTS

| | | |
|---|---|---|
| 7,154,928 B2 | 12/2006 | Sandstrom et al. |
| 2008/0095209 A1* | 4/2008 | Wakabayashi et al. ......... 372/57 |
| 2010/0193710 A1* | 8/2010 | Wakabayashi et al. ... 250/504 R |
| 2010/0260213 A1* | 10/2010 | Furuya et al. ..................... 372/6 |

* cited by examiner

LARGER ←――――→ SMALLER
TRANSMITTANCE

LASER APPARATUS

CROSS-REFERENCE TO RELATED APPLICATIONS

The present application claims priority from Japanese Patent Application No. 2011-182722 filed Aug. 24, 2011 and Japanese Patent Application No. 2012-149633 filed Jul. 3, 2012.

BACKGROUND

1. Technical Field

The present disclosure relates to laser apparatuses.

2. Related Art

Recently, the miniaturization and increased levels of integration of semiconductor integrated circuits have led to a demand for increase in the resolution of semiconductor exposure apparatuses (hereinafter, referred to as "exposure apparatuses"). Accordingly, advances are being made in the reduction of the wavelengths of light outputted from exposure light sources. In general, gas laser apparatuses are being used as exposure light sources instead of conventional mercury lamps. For example, a KrF excimer laser apparatus that outputs an ultraviolet laser beam having a wavelength of 248 nm and an ArF excimer laser apparatus that outputs an ultraviolet laser beam having a wavelength of 193 nm are used as gas laser apparatuses for exposure.

Immersion exposure, in which a gap between an exposure lens of an exposure apparatus and a wafer is filled with a liquid, has been put into practical use as a next-generation exposure technique. With the immersion exposure, the apparent wavelength of an exposure light source is reduced since the refractive index between the exposure lens and the wafer is changed. In the case where immersion exposure is carried out using an ArF excimer laser apparatus as the exposure light source, the wafer is irradiated with ultraviolet light having a wavelength of 134 nm within the liquid. This technique is called "ArF immersion exposure" (or "ArF immersion lithography").

The spontaneous oscillation widths of a KrF excimer laser apparatus and an ArF excimer laser apparatus are relatively wide, such as between approximately 350 to 400 pm. Therefore, if a projection lens is made of such a material that transmits ultraviolet light such as KrF and ArF laser beams, chromatic aberration occurs in some case, which can cause the resolution to drop. Accordingly, it is necessary to narrow the spectral bandwidth of the laser beam outputted from the gas laser apparatus until the chromatic aberration becomes small enough to be ignored. For this reason, a line narrow module having a line narrowing element (an etalon, a grating or the like) is provided within a laser resonator of the gas laser apparatus so as to narrow the spectral bandwidth in some case. Hereinafter, a laser apparatus in which the spectral bandwidth is narrowed is called a line narrowing laser apparatus.

SUMMARY

A laser apparatus according to an aspect of the present disclosure may include: a master oscillator capable of outputting a laser beam that has a spectrum including at least three wavelength peaks; a multi-wavelength oscillation control mechanism capable of controlling energy of each of the wavelength peaks; a spectrum detecting unit that detects the spectrum of the above-mentioned laser beam; and a controller that controls the multi-wavelength oscillation control mechanism based on a detection result detected by the spectrum detecting unit.

A laser apparatus according to another aspect of the present disclosure may include: a master oscillator capable of outputting at least three laser beams each having a different wavelength; a spectrum detecting unit that detects spectra of the laser beams; and a controller that controls the master oscillator based on a detection result detected by the spectrum detecting unit. Further, the master oscillator may include: at least three semiconductor lasers each capable of oscillating at a different wavelength; an optical path adjustment unit that causes optical paths of the three laser beams at the least outputted from the three semiconductor lasers at the least to substantially coincide with each other; and an oscillation controller that controls the three semiconductor lasers at the least.

BRIEF DESCRIPTION OF THE DRAWINGS

Exemplary embodiments of the present disclosure will be described hereinafter with reference to the appended drawings.

DETAILED DESCRIPTION

Figure 1:
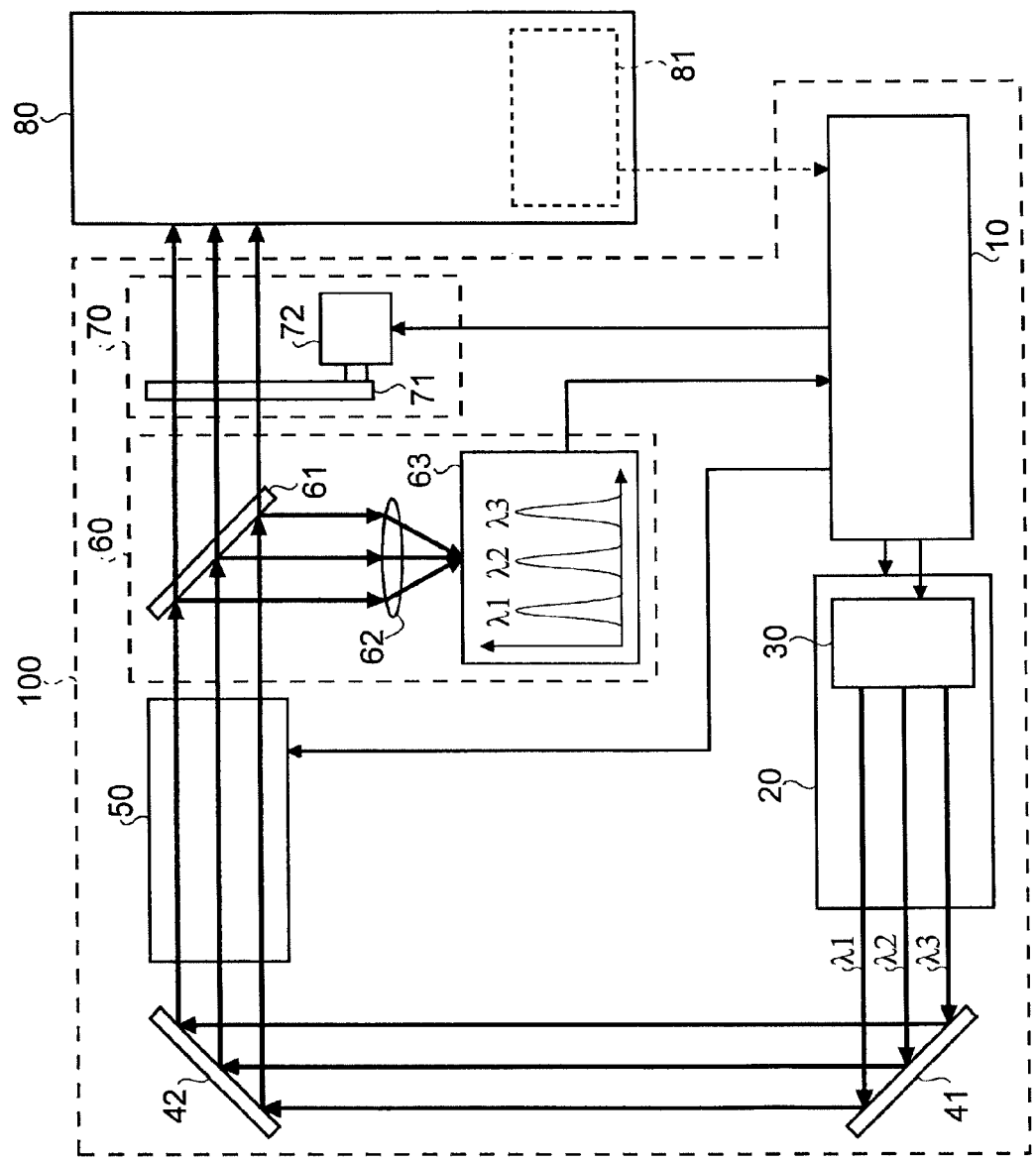
FIG. 1 schematically illustrates an example of a laser apparatus according to an embodiment.

Embodiments of the present disclosure will be described in detail hereinafter with reference to the drawings. The embodiments described hereinafter indicate examples of the present disclosure, and are not intended to limit the content of the present disclosure. Furthermore, not all of the configurations and operations described in the embodiments are required configurations and operations of the present disclosure. Note that identical constituent elements will be given identical reference numerals, and redundant descriptions thereof will be omitted. Note also that in the following descriptions, the embodiments will be described according to the order of the following table of contents.

Contents
1. Outline
2. Description of Terms
3. Multi-Wavelength Oscillation Laser Apparatus
   3.1 Configuration
   3.2 Operation
   3.3 Relationship between Spectral Shape and DOF
   3.4 Relationship between Triple-Wavelength Oscillation Spectral Shape and DOF
   3.5 Operation
4. Operation Flowchart
   4.1 Laser Output Control Operation
   4.2 Multi-Wavelength Oscillation Adjustment Subroutine
   4.3 One-Pulse Control Subroutine
5. Master Oscillator System
   5.1 Master Oscillator System Using Excimer Laser Apparatus
      5.1.1 System Configuration Example-1 Using Wedge Prism 5.1.2 System Configuration Example-2 Using Wedge Prism 5.1.3 System Configuration Example-3 Using Cylindrical Lens 5.2 Master Oscillator System Using Solid-State Laser Apparatus 5.2.1 System Configuration Example-1 Where Plurality of Laser Beams Overlap Spatially and Temporally 5.2.2 System Configuration Example-2 Where Plurality of Laser Beams Are Spatially Separated 5.2.3 System Configuration Example-3 Where Plurality of Laser Beams Are Spatially Separated 5.2.4 System Configuration Example-4 Where Plurality of Laser Beams Are Temporally Separated 5.2.5 System Configuration Example-5 Where Part of Each of Plurality of Laser Beams Spatially Overlaps Each Other 5.2.6 System Configuration Example-6 Where Part of Each of Plurality of Laser Beams Temporally Overlaps Each Other 5.3 Laser Apparatus Equipped with Attenuator 6. Amplifying Apparatus 6.1 Power Amplifier Including Excimer Gas as Gain Medium 6.2 Power Oscillator Including Excimer Gas as Gain Medium 6.2.1 Configuration Example-1 Including Fabry-Perot Resonator 6.2.2 Configuration Example-2 Including Ring Resonator 7. Spectrum Detecting unit 7.1 Monitor Etalon Spectroscope 7.2 Grating Spectroscope 8. Optical Path Tuning Unit 8.1 Configuration for Making Optical Paths Coincide 8.1.1 Optical Path Tuning Unit Including Half Mirror 8.1.2 Optical Path Tuning Unit Including Grating 8.2 Configuration for Making Optical Paths Be Skewed 8.2.1 Optical Path Tuning Unit Including Half Mirror 8.2.2 Optical Path Tuning Unit Including Grating 9. Titanium-Sapphire Amplifier 9.1 Regenerative Amplifier 9.2 Multi-Pass Amplifier 9.3 Power Oscillator 9.3.1 Fabry-Perot Power Oscillator 9.3.2 Ring Power Oscillator 1. Outline In the exemplary embodiments described hereinafter, highly precise control of wavelengths and/or light intensities can be performed so that a spectrum of a laser beam includes at least three peaks.

2. Description of Terms

A KBBF crystal is a nonlinear optical crystal expressed by the chemical formula $KBe_2BO_3F_2$. An LBO crystal is also a nonlinear optical crystal expressed by the chemical formula $LiB_3O_5$. A burst oscillation is such that a pulse-formed laser beam is outputted at a predetermined repetition rate in a predetermined period of time. An optical path is a path through which a laser beam propagates. In the optical path, the side toward the source of the laser beam is referred to as "upstream", whereas the side toward the exposure apparatus is referred to as "downstream".

3. Multi-Wavelength Oscillation Laser Apparatus

An example of a laser apparatus according to an embodiment of the present disclosure will be described hereinbelow with reference to the drawings.

3.1 Configuration

FIG. 1 schematically illustrates an example of a laser apparatus according to an embodiment of the present disclosure. A laser apparatus 100 may include a controller 10, a master oscillator system 20, an amplifying apparatus 50, and a spectral detector 60. The laser apparatus 100 may further include optical systems such as highly reflective mirrors 41 and 42, and a shutter mechanism 70.

The controller 10 may control the overall laser apparatus 100. The controller 10 may be connected with the master oscillator system 20 and a multi-wavelength oscillation control mechanism 30 included in the master oscillator system 20. Further, the controller 10 may be connected with the spectral detector 60 and the shutter mechanism 70. Furthermore, the controller 10 may be connected to a controller 81 of an exposure apparatus 80.

The optical systems such as the highly reflective mirrors 41 and 42 may be disposed on an optical path between the master oscillator system 20 and the amplifying apparatus 50. The amplifying apparatus 50 may amplifies a laser beam L1 having entered via the optical systems. The amplifying apparatus 50 may include an excimer gas or the like as a gain medium inside the apparatus. The amplifying apparatus 50 may operate under the control from the controller 10.

The spectral detector 60 may be disposed on an optical path downstream from the amplifying apparatus 50. The spectral detector 60 may include a beam splitter 61, a light collection lens 62, and a spectrum detecting unit 63. The beam splitter 61 may be disposed on an optical path of the laser beam L1 having been outputted from the amplifying apparatus 50. The light collection lens may be disposed on an optical path of the laser beam L1 having been split by the beam splitter 61. An input portion of the spectrum detecting unit 63 may be arranged on a light collection position of the light collection lens 62 or in the vicinity of the light collection position. The spectrum detecting unit 63 may detect a spectrum of the inputted laser beam L1. The spectrum detecting unit 63 may output the detected spectral data of the laser beam L1 to the controller 10.

The shutter mechanism 70 may be disposed on an optical path downstream from the spectral detector 60. The shutter mechanism 70 may include a shutter 71 and a driving mechanism 72. The driving mechanism 72 may operate under the control from the controller 10, and may push/pull the shutter 71 to/from the optical path of the laser beam L1. The laser beam L1 having passed through the shutter mechanism 70 may be guided to the exposure apparatus 80.

3.2 Operation

Next, an overview of operations of the laser apparatus 100 shown in FIG. 1 is described. The controller 10 may instigate a, laser output control operation in response to an exposure command from the controller 81 of the exposure apparatus 80, for example. The exposure command may be a command that requires a specific exposure process such as contact hole exposure. When the laser output control operation is started, the controller 10 may control the shutter mechanism 70 first to block the optical path of the laser beam L1. Subsequently, the controller 10 may control the master oscillator system 20. The master oscillator system 20, in response to this control, may output a laser beam having a spectrum in which at least three peaks are included.

The controller 10 may control the amplifying apparatus so that the apparatus synchronizes with multi-wavelength oscillation of the master oscillator system 20. The amplifying apparatus 50, according to the control from the controller 10, may excite a gain medium included therein to synchronize with the laser beam L1. The laser beam L1 having entered into the amplifying apparatus 50 may be amplified when passing through the excited gain medium.

The amplified laser beam L1 having been outputted from the amplifying apparatus 50 may enter the spectral detector 60. Upon entering the spectral detector 60, the laser beam L1 may first be split by the beam splitter 61. The split laser beam L1 may be collected on the input portion of the spectrum detecting unit 63 by the light collection lens 62.

The spectrum detecting unit 63 may detect a spectrum of the laser beam L1 collected on its light receiving surface. The spectrum detecting unit 63 may output the detected spectral data to the controller 10. The controller 10 may control the multi-wavelength oscillation control mechanism 30 of the master oscillator system 20 based on the inputted spectral data. Through this, at least one of the light intensities and center wavelengths of the laser beam L1 may be controlled.

3.3 Relationship Between Spectral Shape and DOF

Here, the relationship between the spectral shape of a laser beam used for exposure in the exposure apparatus 80 and depth of focus (DOF) will be described in detail with reference to the drawings.

Figure 2:
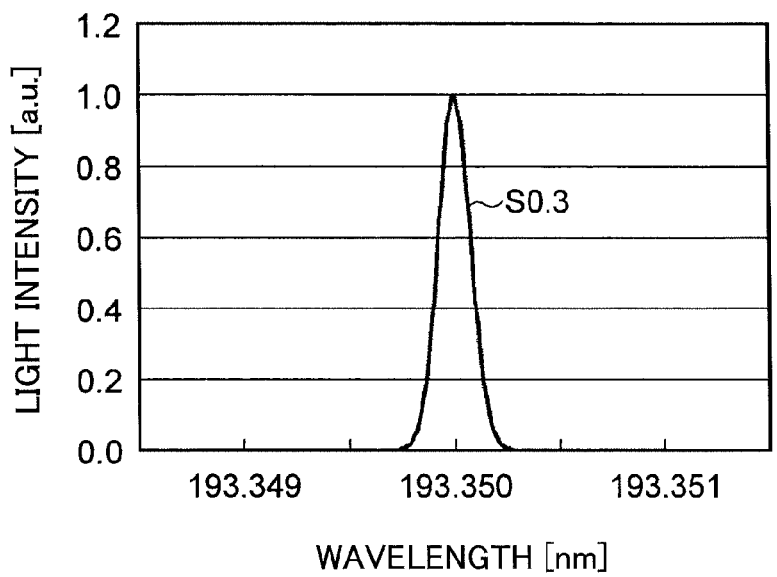
FIG. 2 illustrates an example of a single-peak spectral shape including a waveform having a spectral bandwidth E95 of 0.3 pm.
Figure 3:
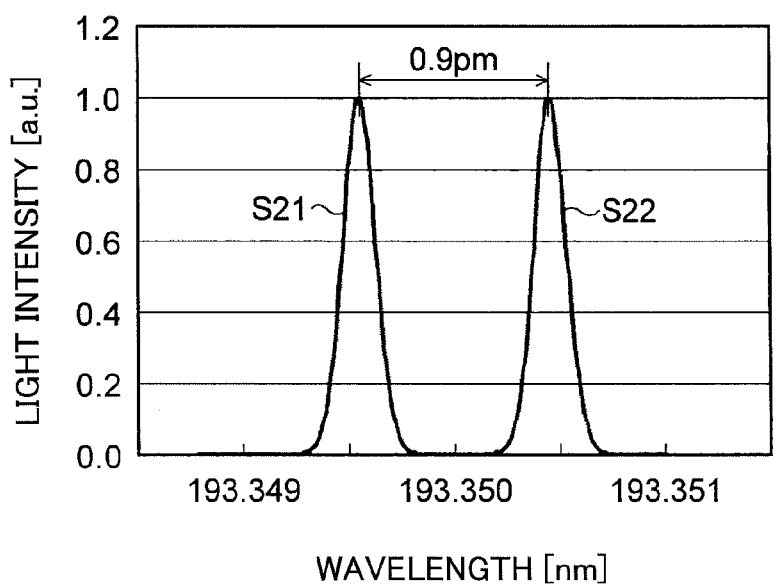
FIG. 3 illustrates an example of a double-peak spectral shape including two waveforms each of which has a spectral bandwidth E95 of 0.3 pm.
Figure 4:
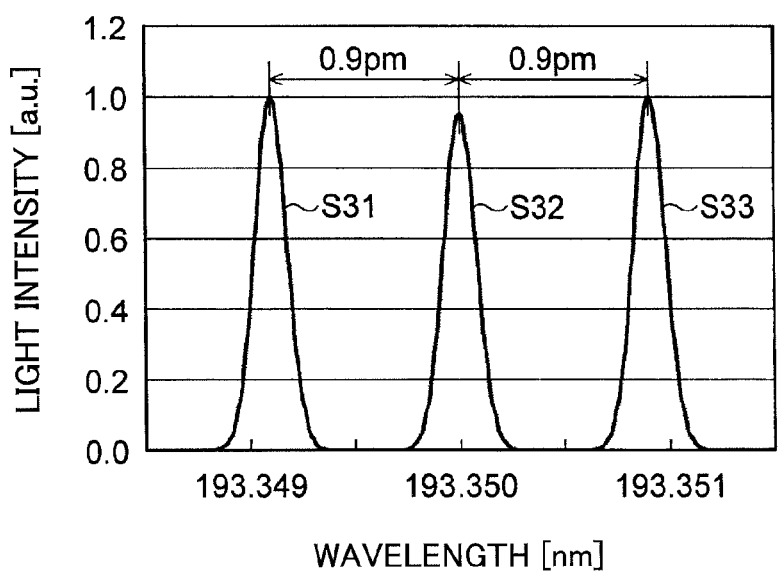
FIG. 4 illustrates an example of a triple-peak spectral shape including three waveforms each of which has a spectral bandwidth E95 of 0.3 pm.
Figure 5:
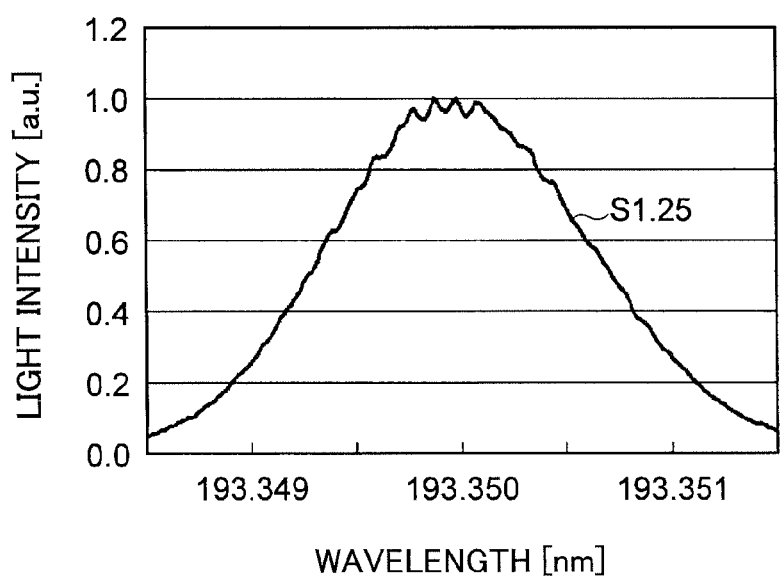
FIG. 5 illustrates an example of a single-peak spectral shape including a relatively broader waveform having a spectral bandwidth E95 of 1.25 pm.

FIG. 2 illustrates an example of a single-peak spectral shape including a waveform S0.3 having a spectral bandwidth E95 of 0.3 pm. FIG. 3 illustrates an example of a double-peak spectral shape including two waveforms S21 and S22 each of which has a spectral bandwidths E95 of 0.3 pm. FIG. 4 illustrates an example of a triple-peak spectral shape including three waveforms S31 through S33 each of which has a spectral bandwidth E95 of 0.3 pm. FIG. 5 illustrates an example of a single-peak spectral shape including a relatively broader waveform S1.25 having a spectral bandwidth E95 of 1.25 pm.

Figure 6:
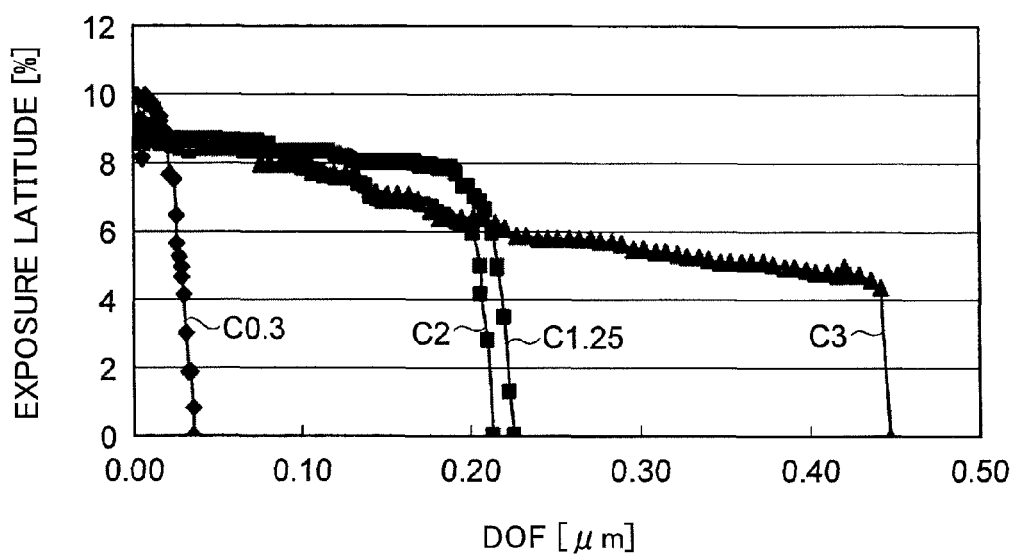
FIG. 6 illustrates relationships between depth of focus (DOF) and exposure latitude (EL) for each of the spectral shapes shown in FIGS. 2 through 5.

FIG. 6 illustrates relationships between depth of focus (DOF) and exposure latitude (EL) for each of the spectral shapes shown in FIGS. 2 through 5. In FIG. 6, C0.3 indicates a relationship between DOF and EL when a laser beam having the spectral shape as shown in FIG. 2 is used. C2 indicates a relationship between DOF and EL when a laser beam having the spectral shape as shown in FIG. 3 is used. C3 indicates a relationship between DOF and EL when a laser beam having the spectral shape as shown in FIG. 4 is used. C1.25 indicates a relationship between DOF and EL when a laser beam having the spectral shape as shown in FIG. 5 is used.

Note that in FIG. 3, peak intensities of the two waveforms S21 and S22 are approximately the same. Further, a difference in wavelength between the peaks of the two waveforms S21 and S22 is 0.9 pm. In FIG. 4, each of the differences in wavelength among the peaks of the three waveforms S31 through S33 is 0.9 pm. Further, among the three waveforms S31 through S33, peak intensities of the waveforms S31 and S33 present on both end sides are approximately the same. Note that the peak intensity of the waveform S32 present between these two waveforms is such that an intensity ratio of the peak intensity of the waveform 32 to the peak intensity of the waveforms S31 and S33 is 0.95. It is also to be noted that each of the center wavelengths of the spectral shapes shown in FIGS. 2 through 5 is substantially 193.350 nm.

As shown in FIG. 6, C3 reaches the deepest depth of focus (DOF) among C0.3, C2, C3 and C1.25. This indicates that the deepest depth of focus (DOF) can be obtained when a laser beam having the triple-peak spectral shape as shown in FIG. 4 is used. Accordingly, it can be assumed that a deeper depth of focus (DOF) can be obtained by using a laser beam having a spectral shape including at least three peaks.

3.4 Relationship Between Triple-Wavelength Oscillation Spectral Shape and DOF

Next, in the case where the peak intensity of a waveform which is present at the center of a triple-peak spectral shape obtained through triple-wavelength oscillation is varied, a relationship between a spectral waveform and DOF is described in detail with reference to the drawings.

Figure 7:
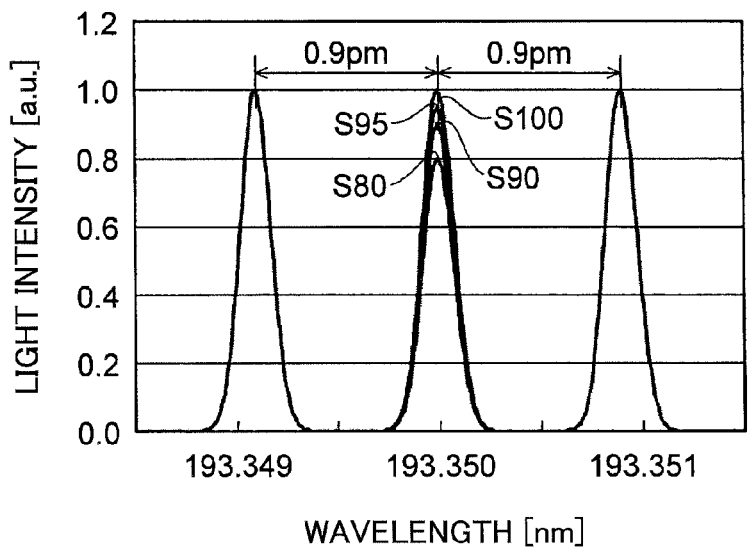
FIG. 7 illustrates examples of a triple-peak spectral shape.

FIG. 7 illustrates several examples of a triple-peak spectral shape. In FIG. 7, S80 denotes a spectral shape in which the intensity ratio of the peak intensity of a waveform at the center to the peak intensity of the waveforms on both end sides is 0.8. S90 denotes a spectral shape in which the intensity ratio of the peak intensity of the waveform at the center to the peak intensity of the waveforms on both end sides is 0.9. S95 denotes a spectral shape in which the intensity ratio of the peak intensity of the waveform at the center to the peak intensity of the waveforms on both end sides is 0.95. S100 denotes a spectral shape in which the peak intensity of the waveforms on both end sides and the peak intensity of the waveform at the center are the same (intensity ratio 1.00). Note that in FIG. 7, the peak intensities of the waveforms on both end sides are approximately the same. In addition, each of differences in wavelength among the three waveform peaks, with respect to each of the spectral shapes S80, S90, S95, and S100, is 0.9 pm.

Figure 8:
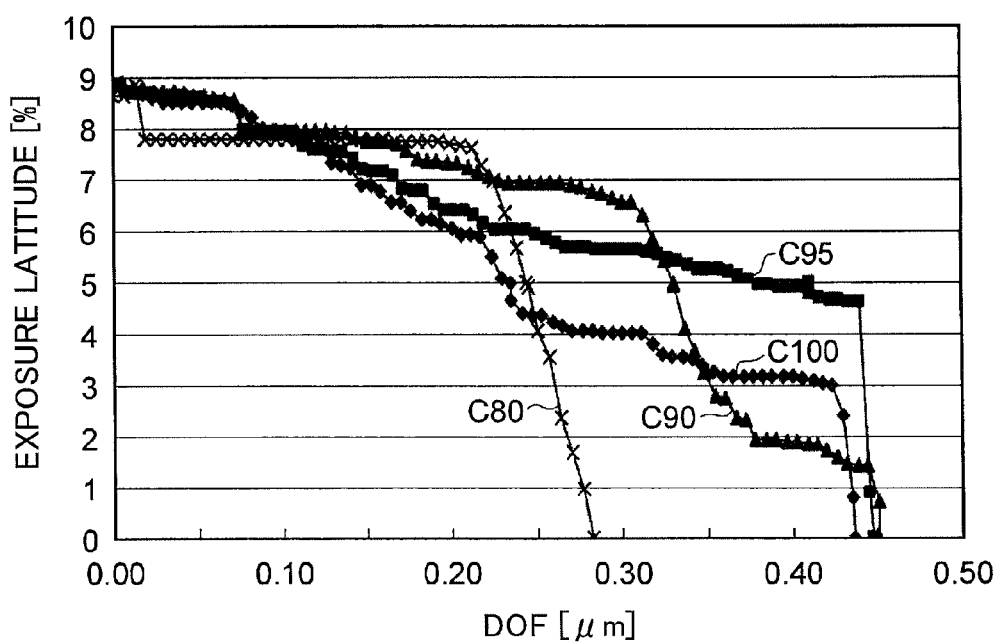
FIG. 8 illustrates relationships between depth of focus (DOF) and exposure latitude (EL) for each of the spectral shapes shown in FIG. 7.

FIG. 8 illustrates relationships between depth of focus (DOF) and exposure latitude (EL) for each of the spectral shapes shown in FIG. 7. In FIG. 8, C80 denotes a relationship between DOF and EL when a laser beam having the spectral shape S80 is used. C90 denotes a relationship between DOF and EL when a laser beam having the spectral shape S90 is used. C95 denotes a relationship between DOF and EL when a laser beam having the spectral shape S95 is used. C100 denotes a relationship between DOF and EL when a laser beam having the spectral shape S100 is used.

As shown in FIG. 8, C95 indicates the most stable relationship curve among C80, C90, C95 and C100. In particular, when the exposure latitude (EL) is in a range of approximately 5%, C95 reaches the deepest depth of focus (DOE). This indicates that the deepest depth of focus (DOE) can be obtained in a stabilized manner when the intensity ratio of the peak intensity of the center waveform to the peak intensity of the waveforms on both end sides is 0.95. From this, it can be understood that it is preferable for the peak intensity of the waveform present between the waveforms on both end sides to be slightly weaker than the peak intensity of the waveforms on both end sides. In addition, it can be also understood that it is preferable for the intensity ratio in the triple-peak spectral shape to be approximately 0.95.

3.5 Operation

As described above, by using a laser beam having a spectrum in which at least three peaks are included, a deeper depth of focus (DOE) can be obtained. In this case, by making the peak intensity of a waveform present between the waveforms on both end sides slightly weaker than that of the waveforms on both end sides, a deeper depth of focus (DOE) can be obtained in a stabilized manner. In a triple-peak spectral shape, for example, it is preferable for the intensity ratio thereof to be approximately 0.95.

4. Operation Flowchart

Figure 9:
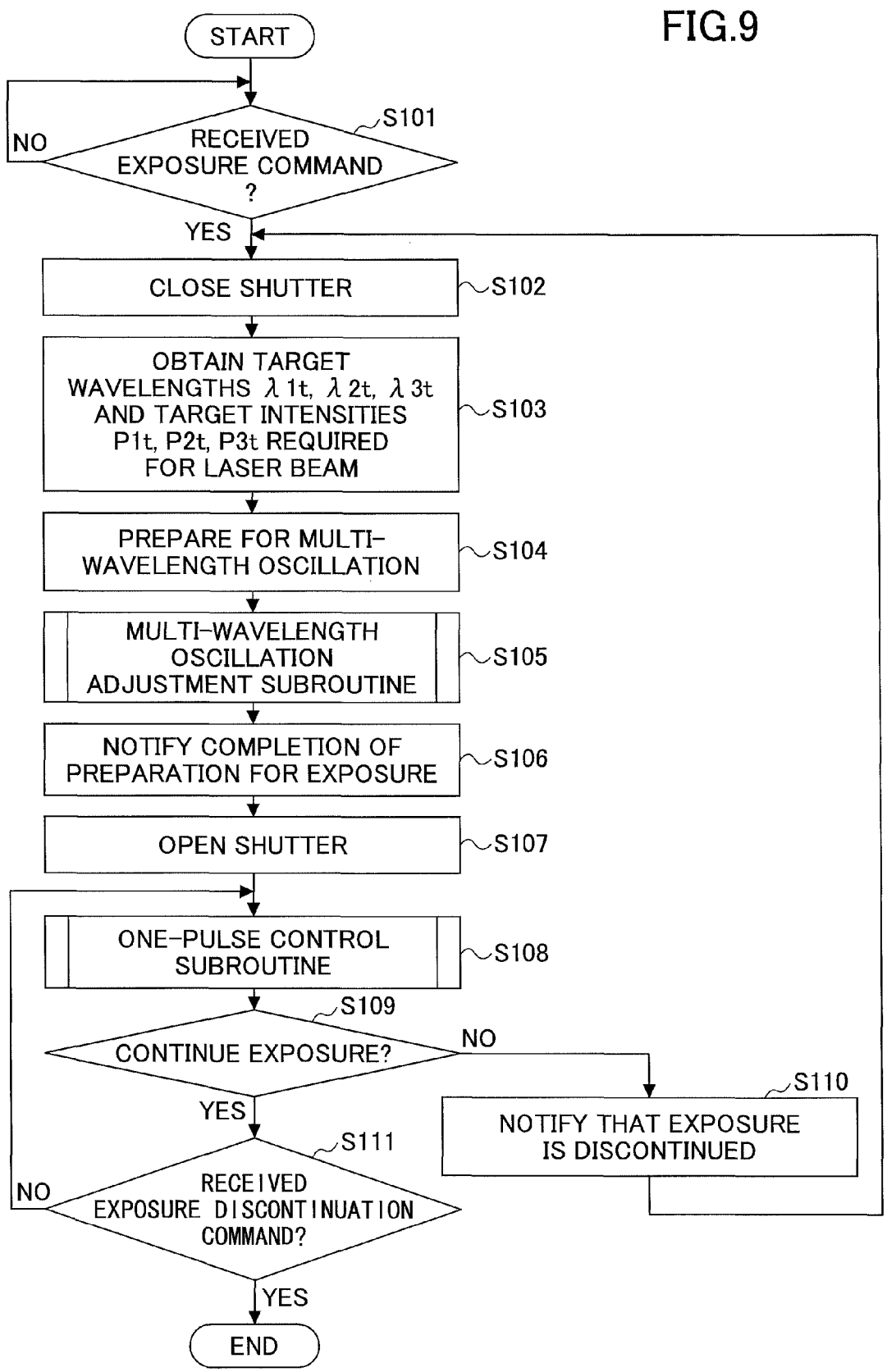
FIG. 9 is a flowchart illustrating an example of a laser output control operation executed by a laser apparatus according to an embodiment.
Figure 10:
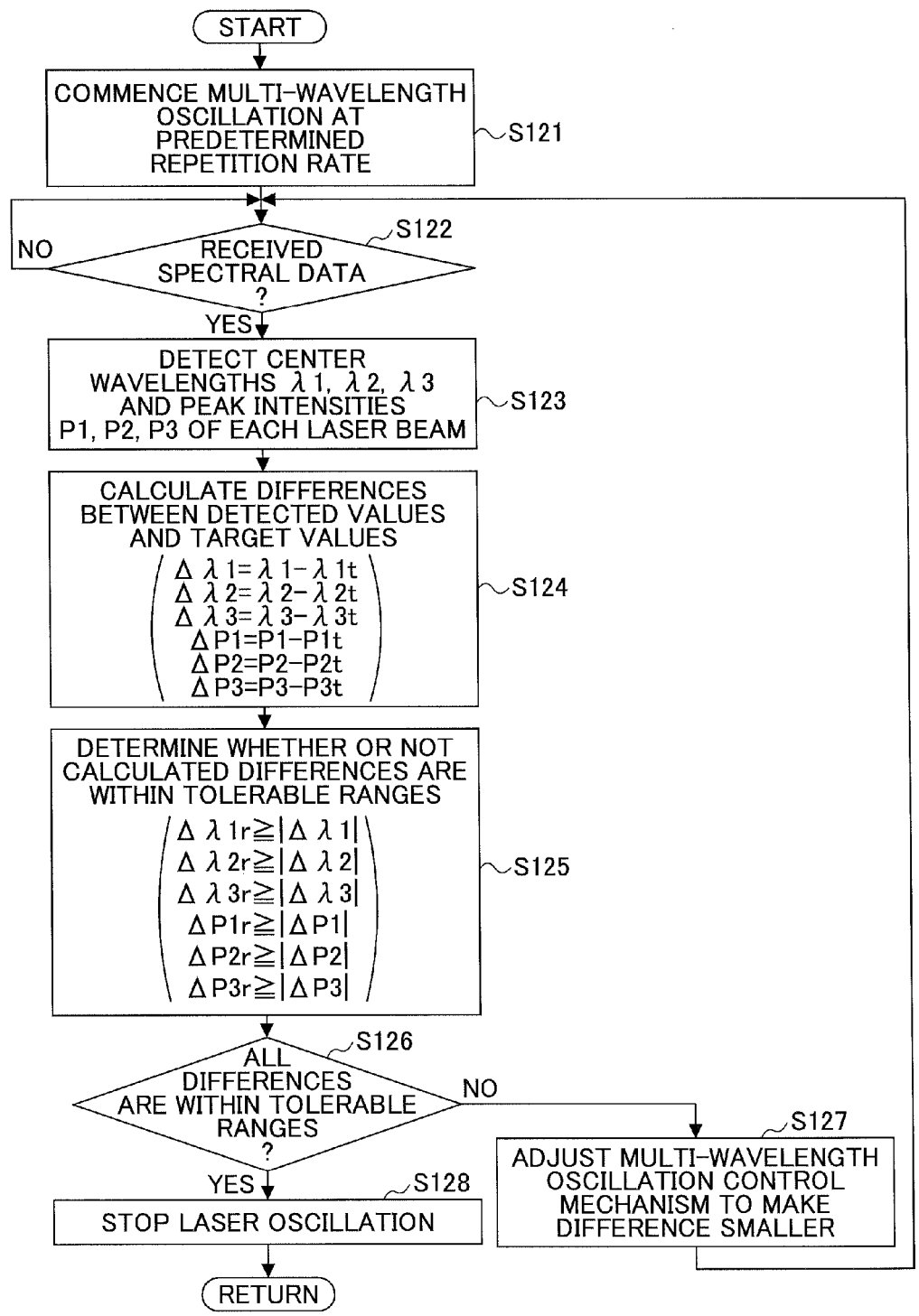
FIG. 10 is a flowchart illustrating an example of a multi-wavelength oscillation adjustment subroutine shown in FIG. 9.
Figure 11:
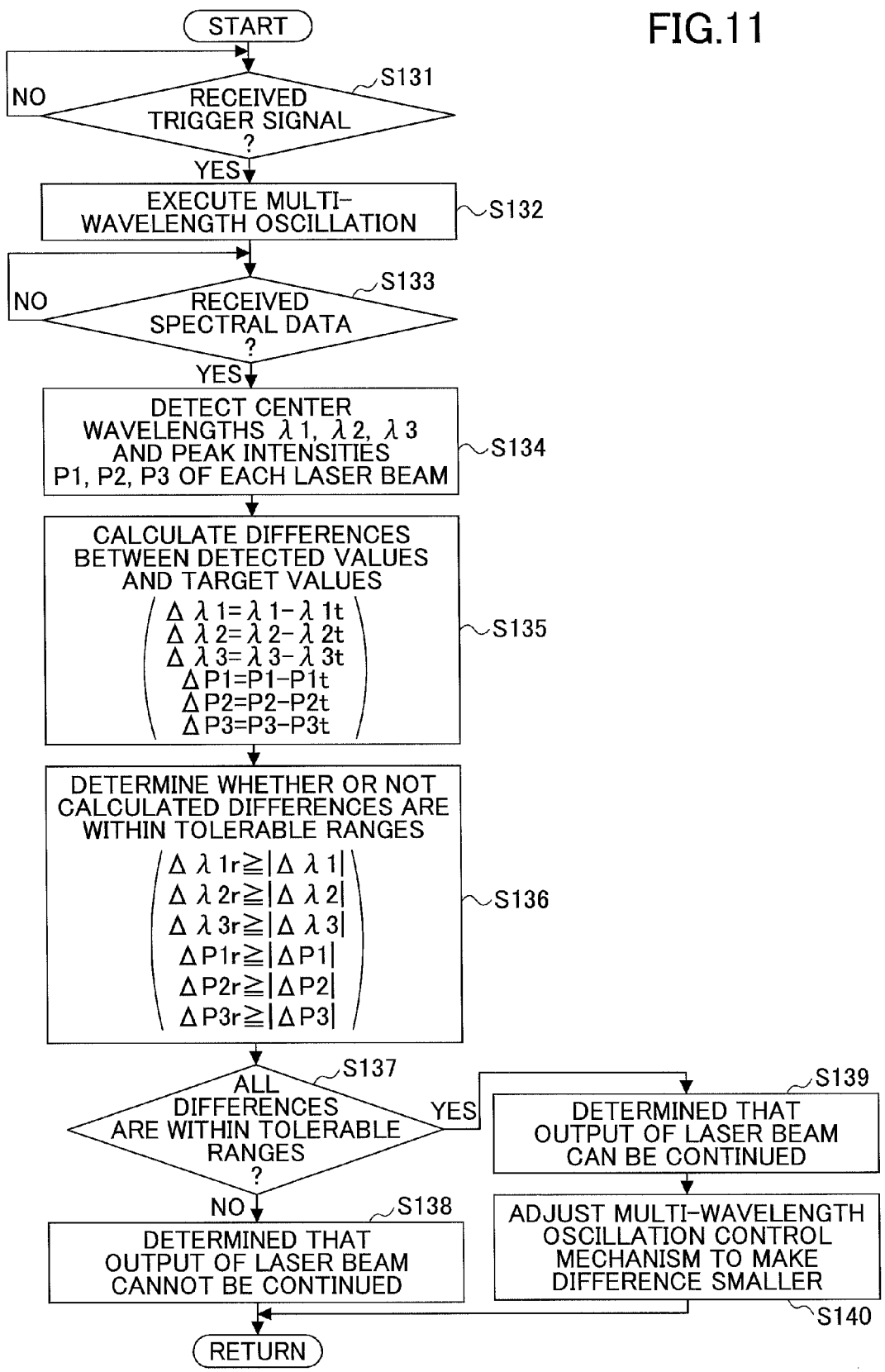
FIG. 11 is a flowchart of an example of a one-pulse control subroutine shown in FIG. 9.

Next, operations of the laser apparatus 100 shown in FIG. 1 will be described in detail with reference to the drawings. FIG. 9 is a flowchart illustrating an example of a laser output control operation executed by the laser apparatus 100. FIG. 10 is a flowchart illustrating an example of a multi-wavelength oscillation adjustment subroutine indicated in step S105 of FIG. 9. FIG. 11 is a flowchart of an example of a one-pulse control subroutine indicated in step S108 of FIG. 9. It is to be noted that in the following descriptions, the operations of the laser apparatus 100 are explained through operations of the controller 10.

4.1 Laser Output Control Operation

As shown in FIG. 9, at first, the controller 10 may stand by until it receives an exposure command from an external device such as the controller 81 included in the exposure apparatus 80 (step S101; NO). Upon receiving the exposure command (step S101; YES), the controller 10 may control the shutter mechanism 70 to block the optical path of a laser beam L1 (step S102). Next, the controller 10 may obtain target wavelengths $\lambda 1t$ through $\lambda 3t$ and target intensities P1$t$ through P3$t$ required for a laser beam L1 (step S103). These target wavelengths $\lambda 1t$ through $\lambda 3t$ and the target intensities P1$t$ through P3$t$ may be stored in a memory (not shown) or the like in advance, or may be included in the exposure command received from the external device at step S101.

Next, the controller 10 may prepare for multi-wavelength oscillation to be carried out by the master oscillator system 20 by transmitting control signals to the master oscillator system 20 and the multi-wavelength oscillation control mechanism 30 included therein (step S104). Thus, the master oscillator system 20 may be in a state where the multi-wavelength oscillation of a laser beam having a predetermined wavelength can be carried out with predetermined excitation energy. The predetermined wavelength and predetermined excitation energy may be set as initial values.

Next, the controller 10 may execute a multi-wavelength oscillation adjustment subroutine that adjusts the center wavelengths and peak intensities of the laser beam L1 outputted through the multi-wavelength oscillation to the target wavelengths and target intensities (step S105). Subsequently, upon completion of the center wavelength and peak intensity adjustment of the laser beam L1, the controller 10 may notify the controller 81 that has issued the exposure command of the completion of preparation for the exposure (step S106).

Next, the controller 10 may control the shutter mechanism 70 to open the optical path of a laser beam L1 (step S107). Subsequently, the controller 10 may execute a one-pulse control subroutine that outputs a laser beam L1 one by one (step S108). Note that in the one-pulse control subroutine, it may be determined whether or not the exposure can be continued.

Next, the controller 10 may determine whether or not to continue the exposure (step S109). This determination may be made based on a result of the determination whether or not to continue the exposure which has been made in the one-pulse control subroutine. In the case where the exposure cannot be continued (step S109; NO), the controller 10 may notify the controller 81 that has issued the exposure command that the exposure is discontinued (step S110). Thereafter, the controller 10 may return to step S102 and repeat the subsequent processings therefrom. On the other hand, in the case where the exposure can be continued (step S109; YES), the controller 10 may subsequently determine whether or not an exposure discontinuation command that requests the discontinuation of exposure has been received from an external device such as the controller 81 of the exposure apparatus 80 (step S111). In the case where the exposure discontinuation command has been received (step S111; YES), the controller 10 may terminate the laser output control operation. On the other hand, in the case where the exposure discontinuation command has not been received yet (step S111; NO), the controller 10 may return to step 108 and repeatedly execute the subsequent processings therefrom.

4.2 Multi-Wavelength Oscillation Adjustment Subroutine

Next, the multi-wavelength oscillation adjustment subroutine indicated in step S105 of FIG. 9 will be described. As shown in FIG. 10, in the multi-wavelength oscillation adjustment subroutine, the controller 10 may first commence multi-wavelength oscillation that outputs a laser beam L1 at a predetermined repetition rate (step S121). Subsequently, the controller 10 may stand by until it receives spectral data of the laser beam L1 from the spectral detector 60 (step S122; NO). Upon receiving the spectral data (step S122; YES), the controller 10 may detect center wavelengths $\lambda 1$ through $\lambda 3$ and peak intensities P1 through P3 of each of the laser beams L1 from the received spectral data (step S123).

Next, the controller 10 may calculate differences $\Delta \lambda 1$ through $\Delta \lambda 3$ between the detected center wavelengths $\lambda 1$ through $\lambda 3$ and the target wavelengths $\lambda 1t$ through $\lambda 3t$, and differences $\Delta P1$ through $\Delta P3$ between the detected peak intensities P1 through P3 and the target intensities P1$t$ through P3$t$ (step S124). Subsequently, the controller 10 may determine whether or not the calculated differences $\Delta \lambda 1$ through $\Delta \lambda 3$ and $\Delta P1$ through $\Delta P3$ are within the tolerable ranges (step S125). In this determination processing, it may be determined whether or not the absolute values of the differences $\Delta \lambda 1$ through $\Delta \lambda 3$ and $\Delta P1$ through $\Delta P3$ are less than threshold values $\Delta \lambda 1r$ through $\Delta \lambda 3r$ and $\Delta P1r$ through $\Delta P3r$, respectively. The threshold values $\Delta \lambda 1r$ through $\Delta \lambda 3r$ and $\Delta P1r$ to $\Delta P3r$ may be stored in a memory (not shown) or the like in advance or included in the exposure command received from the external device at step S101.

Next, the controller 10 may determine whether or not all of the differences are within the tolerable ranges (step S126). If any one of the differences is not within the corresponding tolerable range (step S126; NO), the controller 10 may control the multi-wavelength oscillation control mechanism 30 to make at least the difference having been determined to be out of the tolerable range become smaller (step S127). The amount of control data supplied to the multi-wavelength oscillation control mechanism 30 may be calculated by the controller 10 based on the above calculated differences every time those differences are calculated, or may be related to the difference in advance. Alternatively, a predetermined amount of control data may be supplied to the multi-wavelength oscillation control mechanism 30 in accordance with the type of the difference and the sign thereof. Thereafter, the controller 10 may return to step S122 to repeat the subsequent processings therefrom. Meanwhile, in the case where all of the differences are within the tolerable ranges (step S126; YES), the controller 10 may stop the multi-wavelength oscillation (step S128). Then, the controller 10 may return to the laser output control operation illustrated in FIG. 9.

By executing the multi-wavelength oscillation adjustment subroutine as described above, the center wavelengths and peak intensities of the laser beam L1 may be so adjusted as to be within the tolerable ranges with respect to the target wavelengths and target intensities.

4.3 One-Pulse Control Subroutine

Next, the one-pulse control subroutine indicated in step S108 of FIG. 9 will be described below. As shown in FIG. 11, in the one-pulse control subroutine, the controller 10 may stand by at first until it receives a trigger signal that indicates the timing of multi-wavelength oscillation (step S131; NO). The trigger signal may be transmitted from an external device such as the controller 81 of the exposure apparatus 80. Alternatively, a clock signal generated by a clock generator or the like, or a signal obtained by performing frequency-dividing on the generated clock signal may be used as the trigger signal.

Upon receiving the trigger signal (step S131; YES), the controller 10 may execute multi-wavelength oscillation that outputs one pulse (step S132). Subsequently, the controller 10 may stand by until it receives spectral data of the laser beam L1 from the spectral detector 60 (step S133; NO). Upon receiving the spectral data (step S133; YES), the controller 10 may detect the center wavelengths λ1 through λ3 and the peak intensities P1 through P3 of the laser beams L1 from the received spectral data (step S134).

Next, the controller 10 may calculate the differences Δλ1 through Δλ3 between the detected center wavelengths λ1 through λ3 and the target wavelengths λ1t through λ3t, and the differences ΔP1 through ΔP3 between the detected peak intensities P1 through P3 and the target intensities P1t through P3t (step S135). Subsequently, the controller 10 may determine whether or not the calculated differences Δλ1 through Δλ3 and ΔP1 through ΔP3 are within the tolerable ranges (step S136). In this determination processing, it may be determined whether or not the absolute values of the differences Δλ1 through Δλ3 and ΔP1 through ΔP3 are less than the threshold values Δλ1r through Δλ3r and ΔP1r through ΔP3r, respectively. The threshold values Δλ11r through Δλ3r and ΔP1r through ΔP3r may be stored in a memory (not shown) or the like in advance or included in the exposure command received from the external device at step S101.

Next, the controller 10 may determine whether or not all of the differences are within the tolerable ranges (step S137). If any one of the differences is not within the corresponding tolerable range (step S137; NO), the controller 10 may determine that the output of the laser beam cannot be continued (step S138). Thereafter, the controller 10 may return to the laser output control operation illustrated in FIG. 9. Meanwhile, in the case where all of the differences are within the tolerable ranges (step S137; YES), the controller 10 may determine that the output of the laser beam can be continued (step S139). Subsequently, the controller 10 may control the multi-wavelength oscillation control mechanism 30 to make at least the difference having been determined to be out of the tolerable range become smaller (step S140). The amount of control data supplied to the multi-wavelength oscillation control mechanism 30 may be calculated by the controller 10 based on the above calculated differences every time those differences are calculated, or may be related to the difference in advance. Alternatively, a predetermined amount of control data may be supplied to the multi-wavelength oscillation control mechanism 30 in accordance with the type of the difference and the sign thereof. Thereafter, the controller 10 may return to the laser output control operation illustrated in FIG. 9.

By executing the one-pulse control subroutine as described above, the multi-wavelength oscillation control mechanism 30 can be adjusted for every one-pulse, thereby making it possible to output a more stabilized laser beam L1.

The case of one-pulse control is described in the present embodiment. However, the invention is not limited to this embodiment; that is, center wavelengths and peak intensities of a plurality of laser pulses may be averaged. Then, based on the averaged data, determinations may be made and control signals may be transmitted to the multi-wavelength oscillation control mechanism 30.

5. Master Oscillator System

Concrete examples of the master oscillator system 20 shown in FIG. 1 will be described in detail with reference to the drawings.

5.1 Master Oscillator System Using Excimer Laser Apparatus

In the case where an excimer laser apparatus is used, the center wavelengths and/or light intensities of a laser beam L1 may be adjusted by the multi-wavelength oscillation control mechanism 30, and the laser beam L1 having a spectrum in which at least three peaks are included may be outputted from the master oscillator system 20.

5.1.1 System Configuration Example-1 Using Wedge Prism

Figure 12:
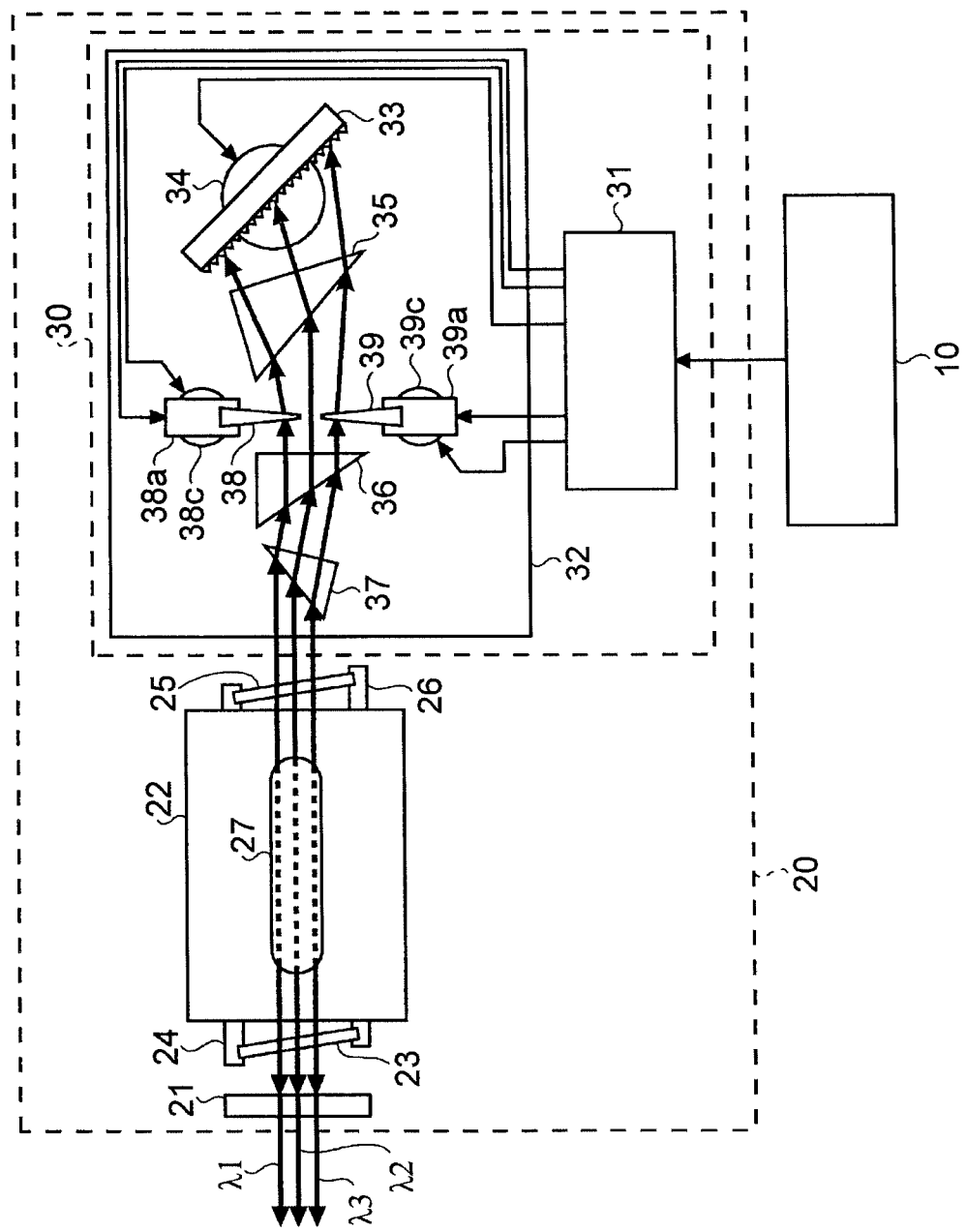
FIG. 12 illustrates an example of a general configuration of a master oscillator system using an excimer laser apparatus according to an embodiment.

FIG. 12 illustrates an example of a general configuration of the master oscillator system 20 using an excimer laser apparatus. As shown in FIG. 12, the master oscillator system 20 may include an output coupling mirror 21, a laser chamber 22, and the multi-wavelength oscillation control mechanism 30. The laser chamber 22 may include windows 23 and 25, window holders 24 and 26, and a pair of discharge electrodes 27 (27a, 27b). Further, the interior of the laser chamber 22 may be filled with an excimer gas as a laser medium. The multi-wavelength oscillation control mechanism 30 may include a controller 31, a grating 33, a plurality of prisms 35 through 37, and two optical elements such as wedge prisms 38 and 39.

The output coupling mirror 21 and the grating 33 may configure an optical resonator. The output coupling mirror 21 may function as a laser output terminal of the master oscillator system 20. The grating 33 may function as a wavelength filter to select a wavelength of a laser beam that can be present in the optical resonator. The laser chamber 22 may be disposed on an optical path of the laser beam L1 that travels in the optical resonator.

The prisms 35 through 37 may determine an optical path of the laser beam traveling back and forth in the optical resonator and an angle of incidence thereof to the grating 33. The prisms 35 through 37 may be disposed on a rack 32. The grating 33 may be held by a rotational stage 34 in a rotatable manner. The rotational stage 34 may be disposed on the rack 32.

Figure 13:
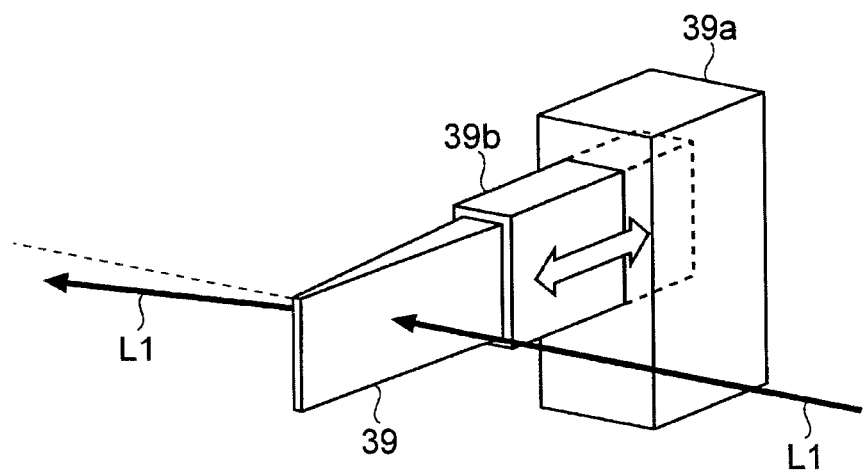
FIG. 13 illustrates an example of a wedge prism and a movement stage in combination according to an embodiment.

FIG. 13 illustrates an example of the wedge prism 39 and a movement stage 39a in combination. The movement stage 39a may be equipped with an arm unit 39b which can be pushed/pulled in the horizontal direction. The wedge prism 39 may be attached on a tip of the arm unit 39b. The wedge prism 38 and a movement stage 38a may be similar to the wedge prism 39 and the movement stage 39a.

The rotational stage 34, the movement stages 38a and 39a, and rotational stages 38c and 39c may be respectively controlled by the controller 31. The controller 31 may control them according to a command from the controller 10.

Next, operations of the master oscillator system 20 illustrated in FIG. 12 will be described. Under the control from the controller 10, for example, excitation energy may be given to the pair of discharge electrodes 27 within the laser chamber 22 from a power source (not shown). The controller 31, upon receiving a command of multi-waveform oscillation from the controller 10, may drive the movement stages 38a and 39a to insert each of the wedge prisms 38 and 39 into part of the optical path in the optical resonator. For example, in FIG. 12, the wedge prism 38 may be inserted into part of the optical path from the upper side toward the lower side in the drawing. Meanwhile, the wedge prism 39 may be inserted into part of the optical path from the lower side toward the upper side in the drawing at a position facing the wedge prism 38. A gap through which the laser beam L1 passes may be present between the inserted wedge prisms 38 and 39. With this, some portion of the laser beam L1 traveling toward the grating 33 passes through the wedge prism 38 or 39. The laser beam having passed through the wedge prisms 38 and 39 is incident upon the grating 33 at a different incidence angle from that of the laser beam that does not pass through these wedge prisms. As described above, by adjusting an incidence angle of part of the laser beam L1 to the grating 33, a laser beam having a spectrum in which three peaks are included may be outputted from the master oscillator 20.

Further, under the control from the controller 10, for example, the controller 31 may drive the rotational stage 38c to rotate the wedge prism 38 together with the movement stage 38a. The wedge prism 39 may be moved in a similar manner. Through this, at least one of the center waves and peak intensities of the laser beam L1 can be adjusted.

Furthermore, under the control from the controller 10, for example, the controller 31 may drive the rotational stage 34 to rotate the grating 33. Through this, the center waves of the laser beam L1 can be adjusted.

5.1.2 System Configuration Example-2 Using Wedge Prism

Figure 14:
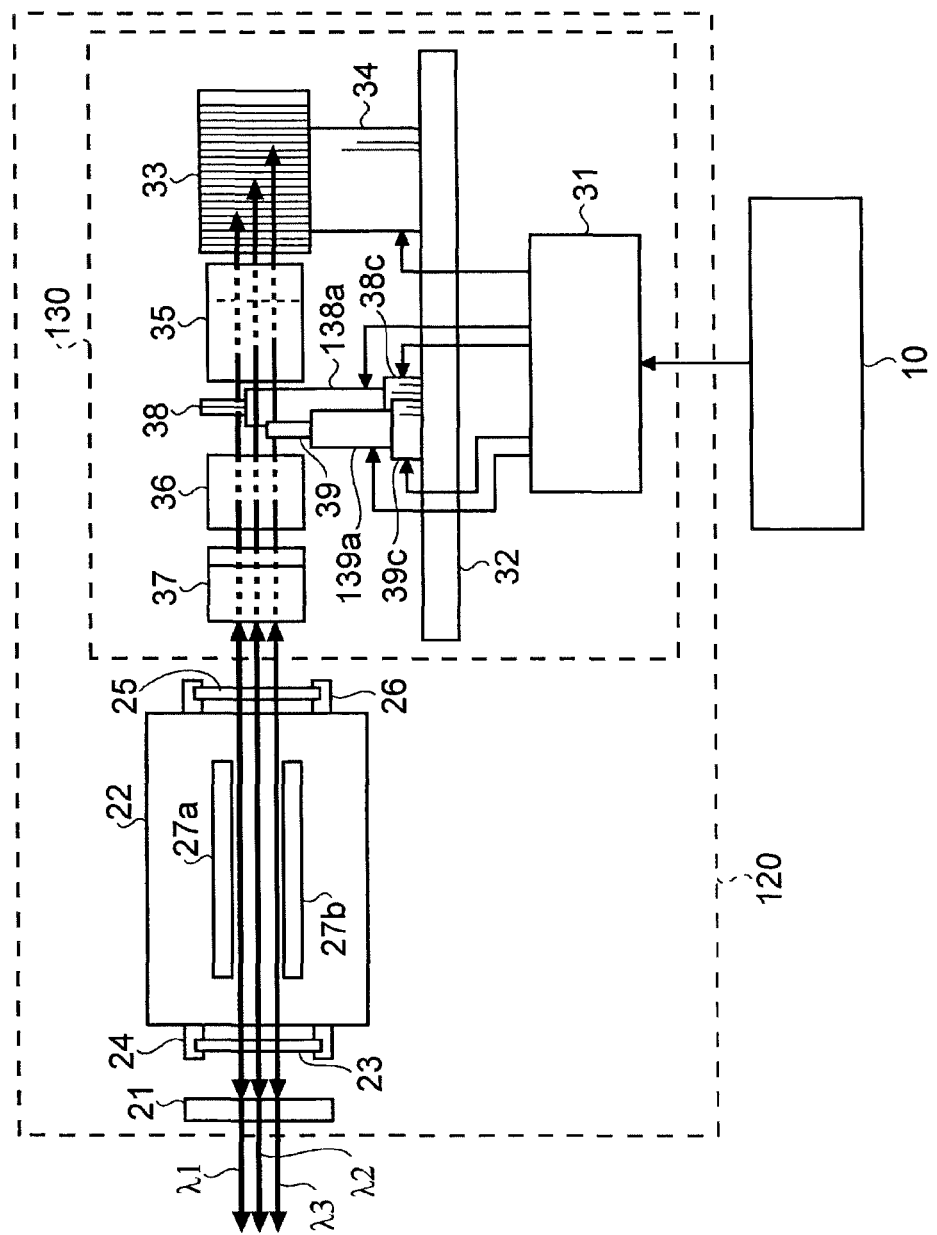
FIG. 14 illustrates another example of a general configuration of a master oscillator system using an excimer laser apparatus.
Figure 15:
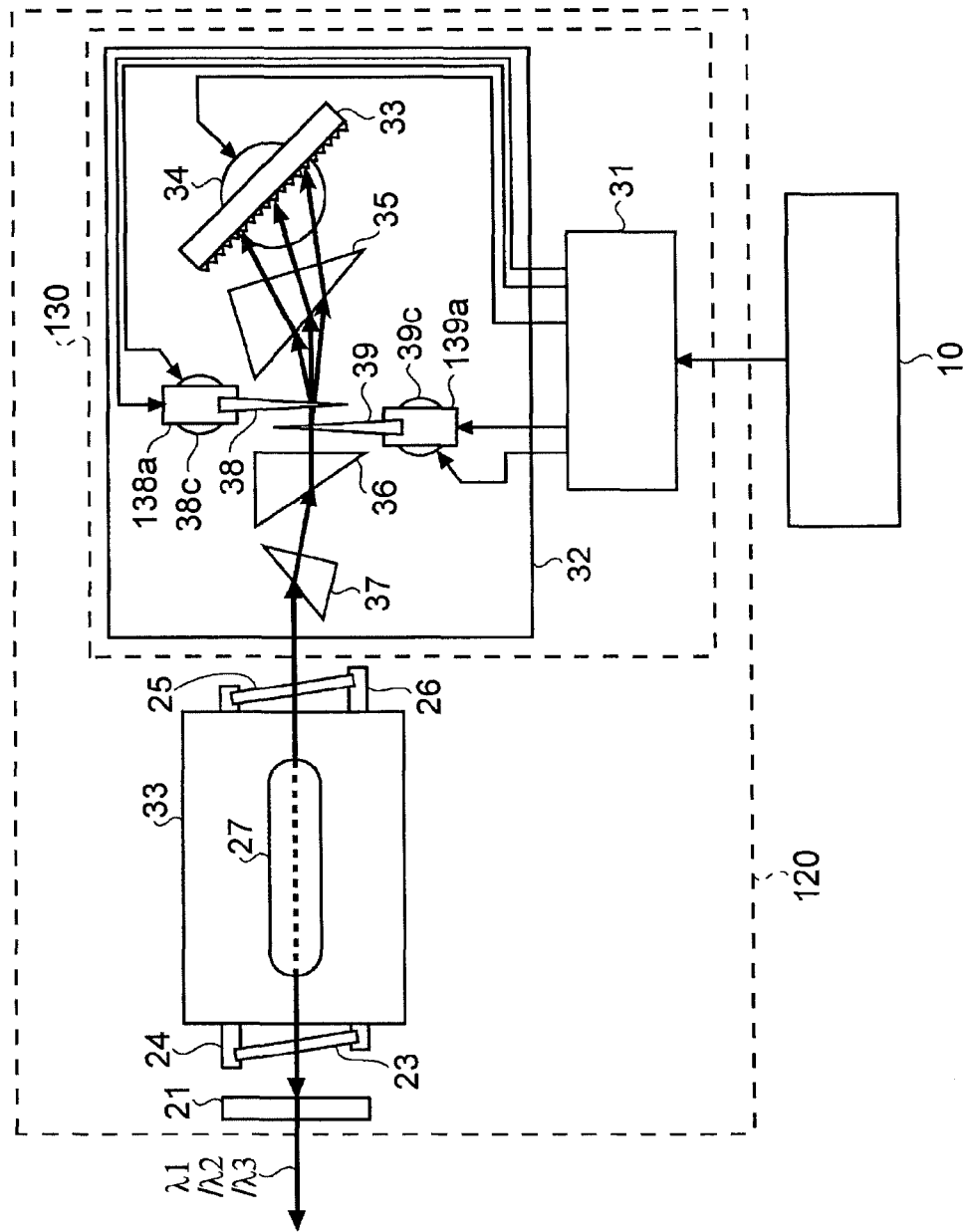
FIG. 15 is a top view of the master oscillator system shown in FIG. 14 when viewed from above the mounting surface of a rack in the vertical direction.

FIGS. 14 and 15 illustrate another example of a general configuration of the master oscillator system 20 using an excimer laser apparatus. FIG. 14 is a side view of a master oscillator system 120 when viewed from a direction horizontally parallel to the mounting surface of the rack 32 and substantially perpendicular to the optical path of the laser beam. FIG. 15 is a top view of the master oscillator system 120 when viewed from above the mounting surface of the rack 32 in the vertical direction. In the following description, the same constituent elements as those in the earlier description will be given the same reference numerals, and redundant description thereof will be omitted.

As shown in FIGS. 14 and 15, the master oscillator system 120 may include the same constituent elements as the master oscillation system 20 shown in FIG. 12. However, the master oscillator system 120 may include a multi-wavelength oscillation control mechanism 130 in which the movement stages 38a and 39a are replaced with movement stages 138a and 139a.

Figure 16:
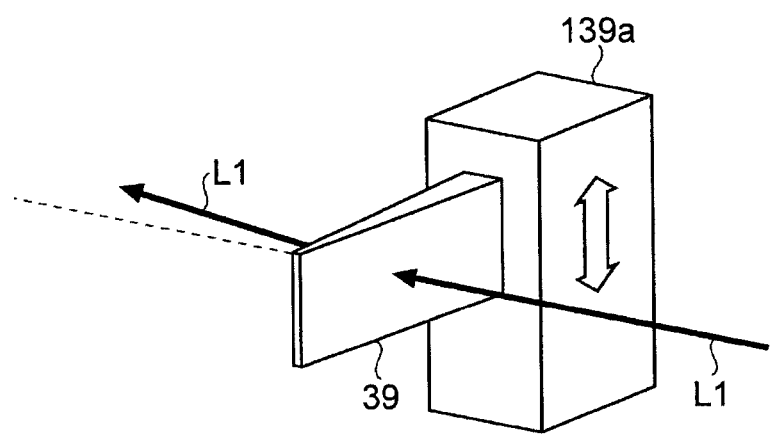
FIG. 16 illustrates another example of a wedge prism and a movement stage in combination according to an embodiment.

FIG. 16 illustrates an example of the wedge prism 39 and the movement stage 139a in combination. The wedge prism 39 may be attached to a side surface of the movement stage 139a. The movement stage 139a may be capable of moving upward and downward. The wedge prism 38 and the movement stage 138a may have the same mechanism as the wedge prism 39 and the movement stage 139a. The movement stages 138a and 139a may be held by the rotational stages 38c and 39c respectively in a rotatable manner.

Upon receiving a command of multi-wavelength oscillation from the controller 10, the controller 31 may drive the movement stages 138a and 139a to insert each of the wedge prisms 38 and 39 into part of the optical path in the optical resonator. In the present example, as shown in FIGS. 14 and 15, the wedge prism 38 may be pushed/pulled to/from the upper region of the optical path in the optical resonator. Meanwhile, the wedge prism 39 may be pushed/pulled to/from the lower region of the optical path in the optical resonator from the opposite side to the wedge prism 38. A gap through which a laser beam passes as is may be present between the inserted wedge prisms 38 and 39. Further, for example, under the control from the controller 10, the controller 31 may drive the rotational stage 38c to rotate the wedge prism 38 together with the movement stage 138a. The wedge prism 39 may be moved in a similar manner. Through this, at least one of the center waves and peak intensities of the laser beam L1 can be adjusted.

Other constituent elements and operations may be the same as those of the master oscillator system 20 shown in FIG. 12.

5.1.3 System Configuration Example-3 Using Cylindrical Lens

Figure 17:
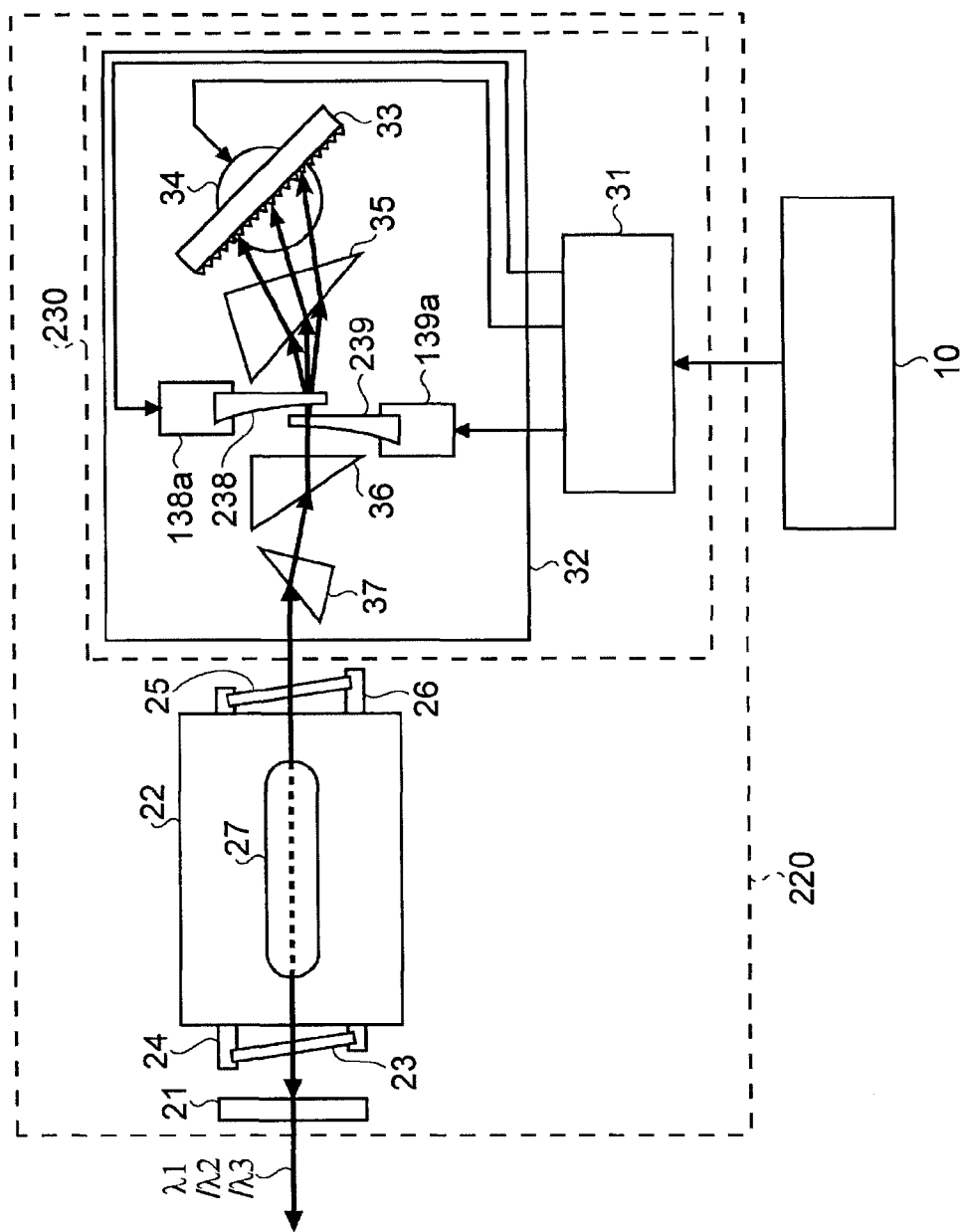
FIG. 17 illustrates another example of a general configuration of a master oscillator system using an excimer laser apparatus according to an embodiment.

FIG. 17 illustrates another example of a general configuration of the master oscillator system 20 using an excimer laser apparatus. FIG. 17 is a top view of a master oscillator system 220 when viewed from above the mounting surface of the rack 32 in the vertical direction. Although the master oscillator system of the present example is provided based on the master oscillator system 120 shown in FIGS. 14 and 15, the master oscillator system is not limited thereto. For example, the master oscillation system may be provided based on the master oscillator system 20 shown in FIG. 12. In the following description, the same constituent elements as those in the earlier description will be given the same reference numerals, and redundant description thereof will be omitted.

As shown in FIG. 17, the master oscillator system 220 may include the same constituent elements as the master oscillator system 120 shown in FIGS. 14 and 15. Note that, however, the master oscillator system 220 may include a multi-wavelength oscillation control mechanism 230 in which the wedge prisms 38 and 39 are replaced with cylindrical half lenses 238 and 239. In addition, the rotational stages 38c and 39c may be omitted in the multi-wavelength oscillation control mechanism 230.

Figure 18:
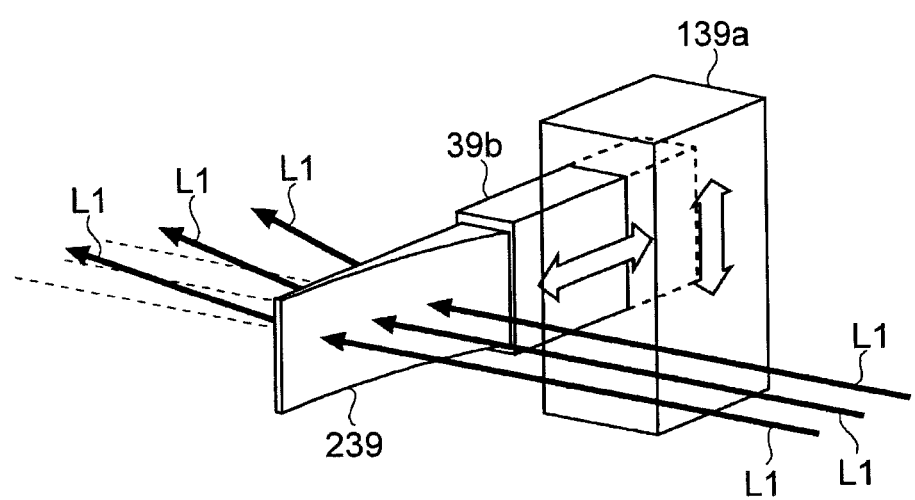
FIG. 18 illustrates an example of a cylindrical half lens and a movement stage in combination according to an embodiment.

FIG. 18 illustrates an example of the cylindrical half lens 239 and the movement stage 139a in combination. The cylindrical half lens 239 may be attached onto a tip of the arm unit 39b of the movement stage 139a. The cylindrical half lens 238 and the movement stage 138a may be the same as the cylindrical half lens 239 and the movement stage 139a. An output angle of a laser beam that has entered the cylindrical half lens 238 or 239 may vary depending on the positions along the movement direction of an arm unit 38b (not shown) or the arm unit 39b.

Upon receiving a command of multi-wavelength oscillation from the controller 10, the controller 31 may drive the movement stages 138a and 139a to insert each of the cylindrical half lenses 238 and 239 into part of an optical path of a laser beam in the optical resonator. In the present example, as shown in FIG. 17, the cylindrical half lens 238 may be pushed/pulled to/from the upper region of the optical path in the optical resonator. Meanwhile, the cylindrical half lens 239 may be pushed/pulled to/from the lower region of the optical path in the optical resonator from the opposite side to the cylindrical half lens 238. A gap through which a laser beam passes as is may be present between the inserted cylindrical half lenses 238 and 239. Further, for example, under the control from the controller 10, the controller 31 may drive the movement stages 138a and 139a to control the protrusion amounts of the arm unit 38b (not shown) and the arm unit 39b. Through this, because a portion of the laser beam L1 that passes through the cylindrical half lenses 238 and 239 changes, the center wavelengths of the laser beam L1 can be adjusted. Meanwhile, the peak intensities may be tuned by tuning the positions of the movement stages 138a and 139a.

Other constituent elements and operations may be the same as those of the master oscillator system 20 shown in FIG. 12 or the master oscillator system 120 shown in FIGS. 14 and 15.

5.2 Master Oscillator System Using Solid-State Laser Apparatus

Next, examples of a general configuration of the master oscillator system 20 using a solid-state laser apparatus such as a semiconductor laser will be explained hereinafter.

Figure 19:
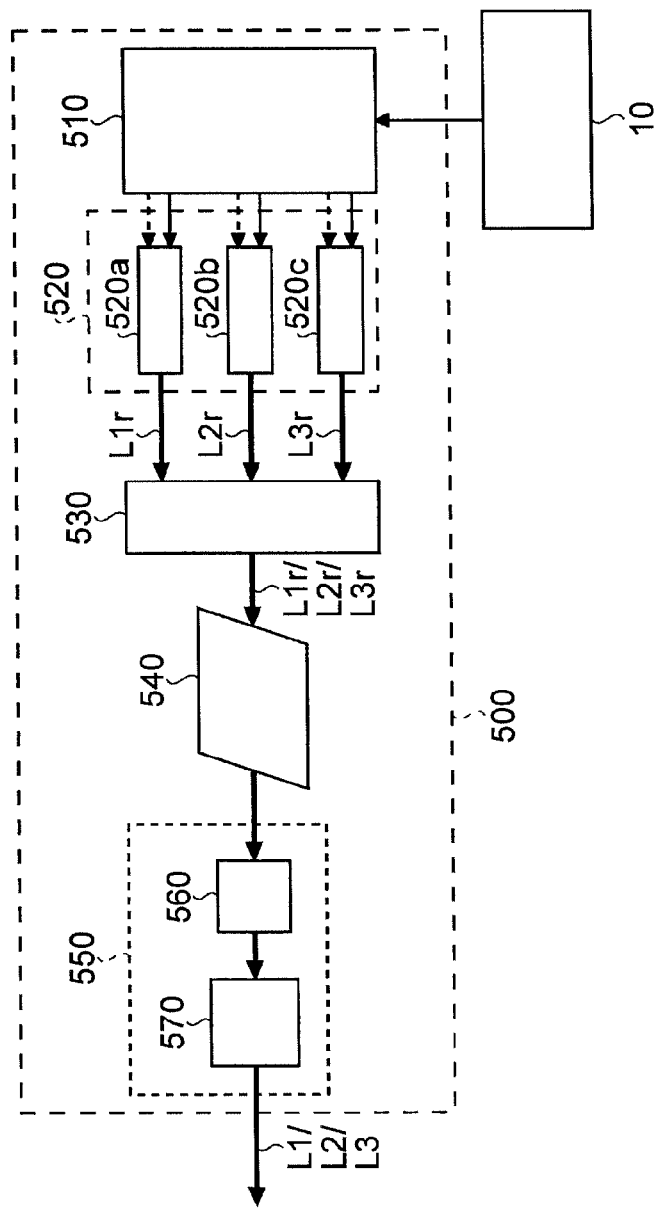
FIG. 19 illustrates another example of a general configuration of a master oscillator system using a semiconductor laser according to an embodiment.

5.2.1 System Configuration Example-1 where Plurality of Laser Beams Overlap Spatially and Temporally FIG. 19 illustrates an example of a general configuration of the master oscillator system 20 using a semiconductor laser. As shown in FIG. 19, a master oscillator system 500 may include a controller 510, a seed light source 520, an optical path tuning unit 530, an amplifier 540, and a wavelength converter 550.

The seed light source 520 may include at least three semiconductor lasers 520a through 520c. Each of the semiconductor lasers 520a through 520c may oscillate in either of the single longitudinal mode and the multi longitudinal mode.

The controller 510, under the control from the controller 10, may cause the semiconductor lasers 520a through 520c to oscillate. The controller 510 may control the oscillation timing, oscillation wavelength and output intensity of each of the semiconductor lasers 520a through 520c.

The optical path tuning unit 530 may cause optical paths of the laser beams L1r through L3r each outputted and supplied from the seed light source 520 via individually different optical paths to substantially coincide with each other. The amplifier 540 may amplify the laser beams L1r through L3r, and may include therein a solid material such as a titanium-sapphire crystal or the like as a gain medium.

The wavelength converter 550 may include, for example, two nonlinear optical crystals. For example, the wavelength converter 550 may include an LBO crystal unit 560 and a KBBF crystal unit 570. The LBO crystal unit 560 may convert the laser beams L1r through L3r to a second harmonic of light thereof. The KBBF crystal unit 570 may further convert the second harmonic of light outputted from the LBO crystal unit 560 to a second harmonic of light thereof (called "fourth harmonic of light", hereinafter). The fourth harmonic of light may be considered to be three individual laser beams L1, L2 and L3, or a single laser beam in which the laser beams L1 through L3 are overlapped.

A trigger signal may be inputted to the controller 510 at a predetermined repetition rate from the controller 10, for example. The controller 510, in response to the inputted trigger signal, may cause the semiconductor lasers 520a through 520c to execute laser-oscillation at a predetermined repetition rate. As a result, the laser beams L1r, L2r and L3r each having different wavelengths can be outputted at the predetermined repetition rate from the seed light source 520. Output timings of the laser beams L1r through L3r may be the same. In this case, the laser beams L1r through L3r can temporally overlap each other.

In the case where the optical paths of the laser beams L1r through L3r are made to substantially coincide with each other by the optical path tuning unit 530, the laser beams L1r through L3r can also overlap spatially. The laser beams L1r through L3r overlapping each other temporally and spatially may be amplified by the amplifier 540. The amplified laser beams L1r through L3r may be converted to the laser beams L1 through L3 or a laser beam including the laser beams L1 through L3, by passing through the wavelength converter 550.

Figure 20:
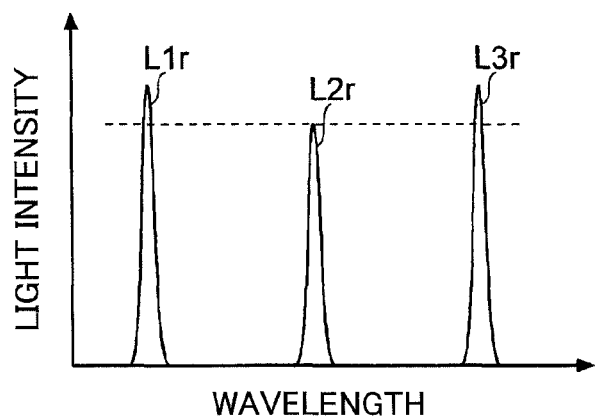
FIG. 20 illustrates a spectrum of laser beams entering an LBO crystal unit according to an embodiment.
Figure 21:
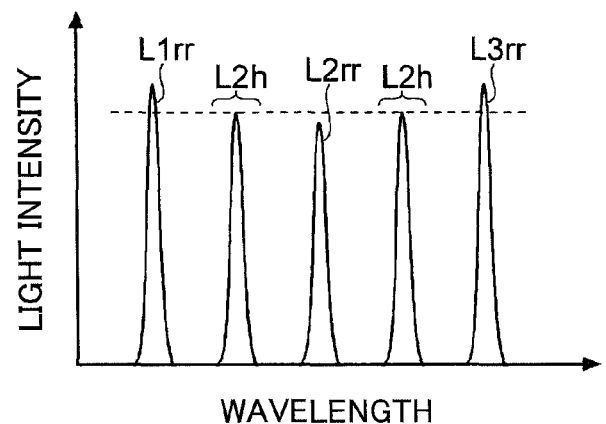
FIG. 21 illustrates a spectrum of laser beams having been outputted from an LBO crystal unit and entering a KBBF crystal unit according to an embodiment.
Figure 22:
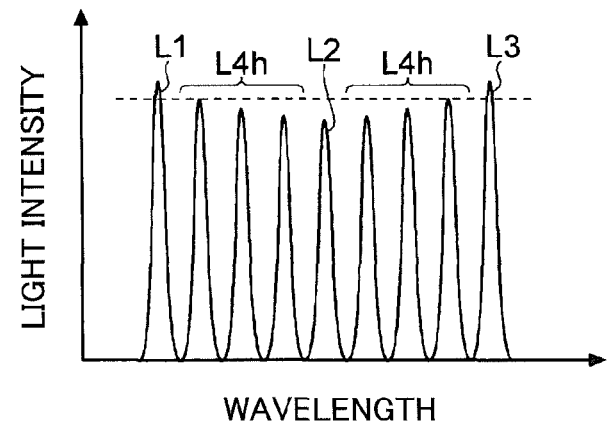
FIG. 22 illustrates a spectrum of laser beams outputted from a KBBF crystal unit according to an embodiment.

Here, spectra of laser beams that pass through the wavelength converter 550 are illustrated in FIGS. 20, 21 and 22.

Among the laser beams L1r through L3r that enter the LBO crystal unit 560, if peak intensity of the laser beam L2r present between the laser beams L1r and L3r is smaller than that of the laser beams L1r and L3r on both end sides as shown in FIG. 20, a second harmonic of light having a spectrum as shown in FIG. 21, in which peak intensities of laser beams L1rr and L3rr on both end sides are larger than those of laser beams L2rr and L2h that are present between the laser beams L1rr and L3rr, can be outputted from the LBO crystal unit 560. Further, a fourth harmonic of light having a spectrum as shown in FIG. 22, in which peak intensities of laser beams L1 and L3 on both end sides are larger than those of laser beams L2 and L4h that are present between the laser beams L1 and L3, can be outputted from the KBBF crystal unit 570.

Peak intensities of the laser beams L1, L2 and L3 outputted from the wavelength converter 550 can be controlled by the tuning of excitation energy (electric current value) that is supplied to the semiconductor lasers 520a through 520c from the controller 510. Wavelengths thereof can also be controlled by the tuning of a wavelength selection property (for example, temperature of a semiconductor) of a wavelength selection element (for example, a grating, not shown) of the semiconductor laser. The controller 510, according to a command from the controller 10, may tune the excitation energy to be supplied to the semiconductor lasers 520a through 520c.

Figure 23:
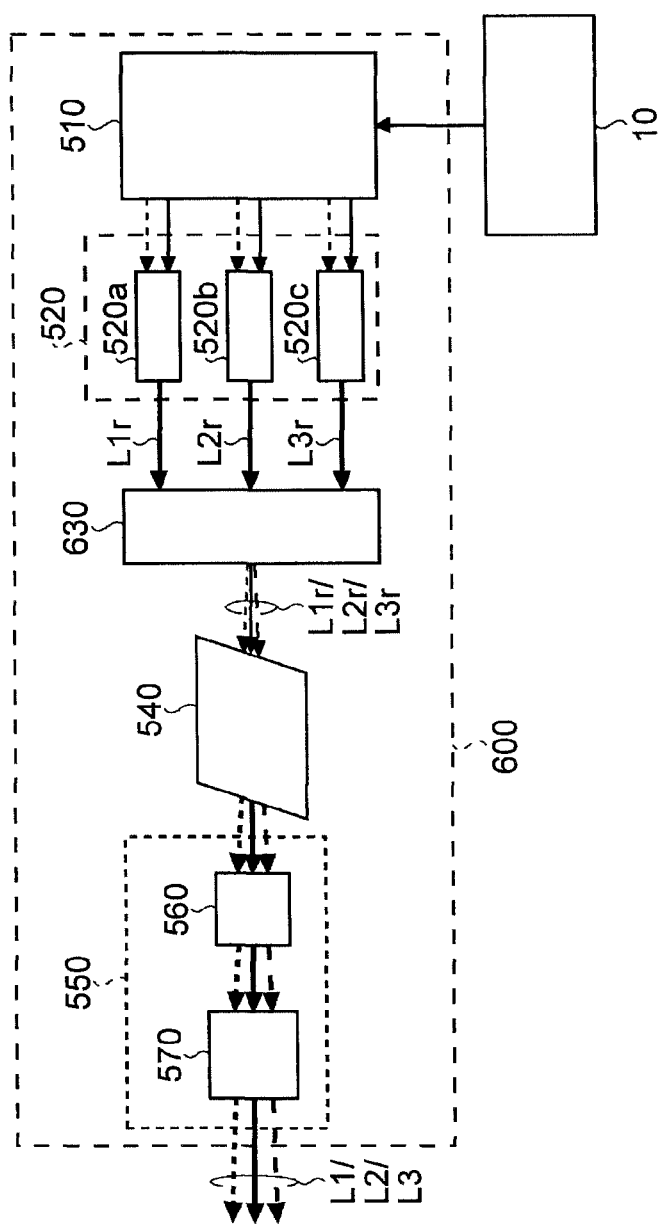
FIG. 23 illustrates another example of a general configuration of a master oscillator system using a semiconductor laser according to an embodiment.
Figure 24:
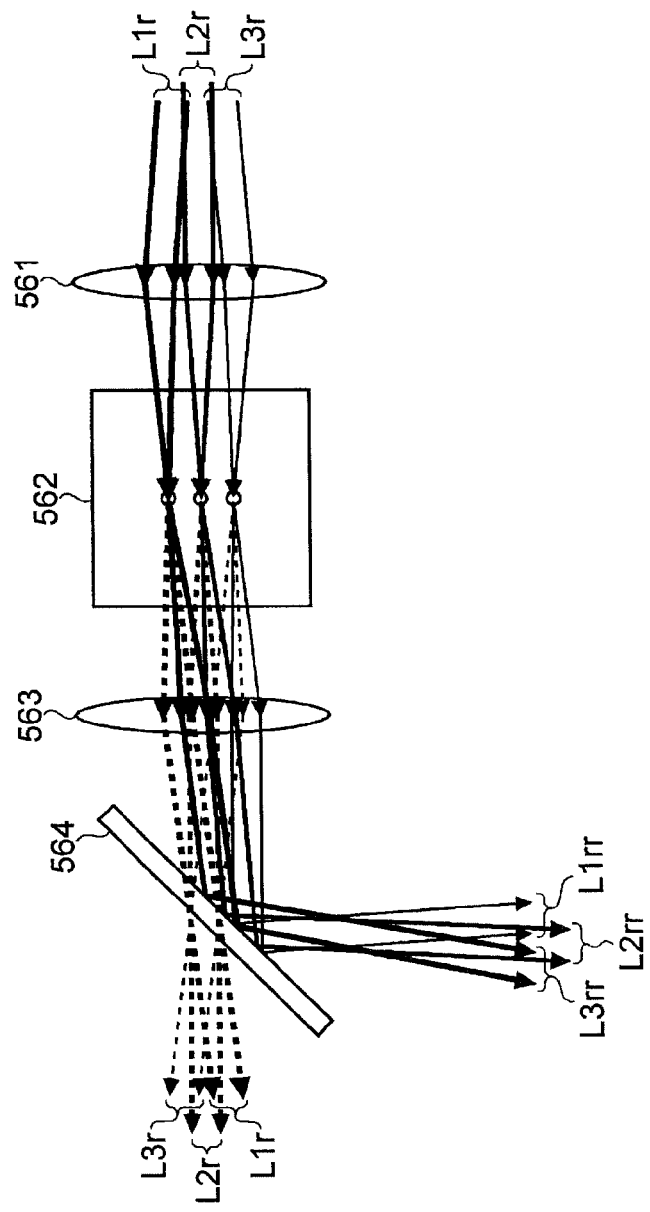
FIG. 24 illustrates an example of a general configuration of the LBO crystal unit shown in FIG. 23.
Figure 25:
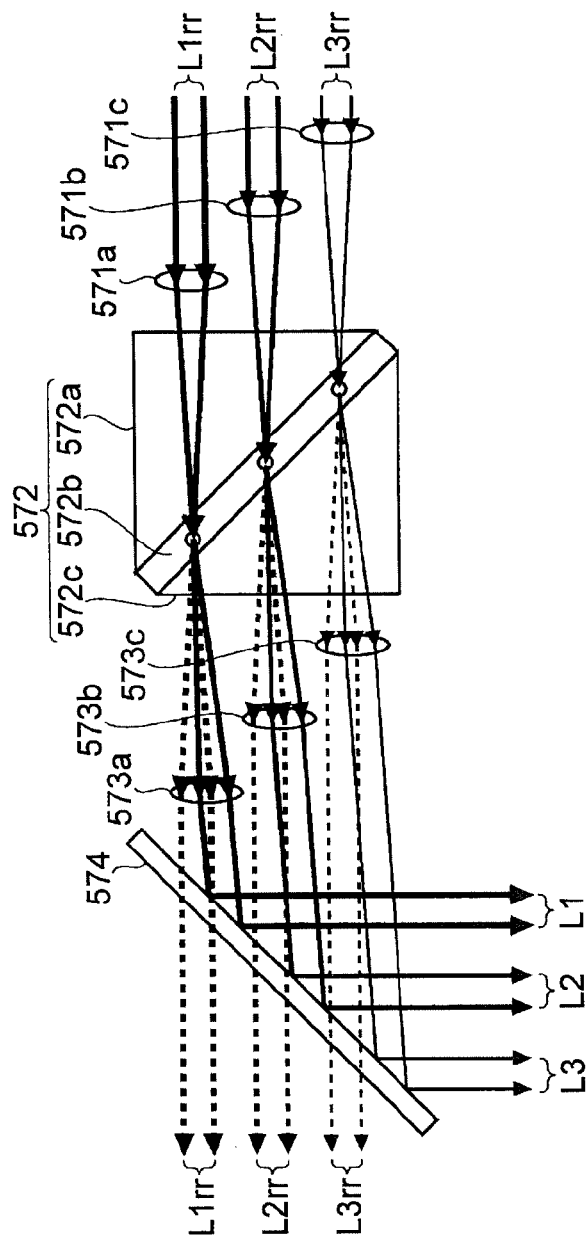
FIG. 25 illustrates an example of a general configuration of the KBBF crystal unit shown in FIG. 23.

5.2.2 System Configuration Example-2 where Plurality of Laser Beams are Spatially Separated FIG. 23 illustrates another example of a general configuration of the master oscillator system 20 using a semiconductor laser. FIG. 24 illustrates an example of a general configuration of the LBO crystal unit 560 shown in FIG. 23. FIG. 25 illustrates an example of a general configuration of the KBBF crystal unit 570 shown in FIG. 23. In the following description, the same constituent elements as those in the earlier description will be given the same reference numerals, and redundant description thereof will be omitted.

As shown in FIG. 23, a master oscillator system 600 may include the same constituent elements as the master oscillator system 500 shown in FIG. 19. Note that, however, the master oscillator system 600 may include an optical path tuning unit 630 in place of the optical path tuning unit 530. The optical path tuning unit 630 can output the laser beams L1r through L3r respectively at different angles.

The laser beams L1r through L3r respectively outputted at different angles from the optical path tuning unit 630 may be amplified by the amplifier 540. The amplified laser beams L1r through L3r may enter the wavelength converter 550.

As shown in FIG. 24, the LBO crystal unit 560 of the wavelength converter 550 may include a light collection lens 561, an LBO crystal 562, a collimator lens 563, and a beam splitter 564. The laser beams L1r through L3r that have entered the wavelength converter 550 may be collected to different positions of the LBO crystal 562 by the light collection lens 561. This makes it possible to reduce the generation of light of difference frequency, light of sum frequency and the like with the laser beams L1r through L3r as the fundamental harmonic of light.

The laser beams L1rr through L3rr outputted from the LBO crystal 562 may be converted to parallel beams by the collimator lens 563. The collimated laser beams L1rr through L3rr may reflect off the beam splitter 564 to enter the KBBF crystal unit 570. The beam splitter 564 may split the laser beams outputted from the LBO crystal 562 into the fundamental harmonic of light (laser beams L1r through L3r) and a second harmonic of light (laser beams L1rr through L3rr). The split laser beams L1r through L3r may be monitored or absorbed by a dumper or the like.

As shown in FIG. 25, the KBBF crystal unit 570 of the wavelength converter 550 may include light collection lenses 571a through 571c, a KBBF crystal assembly 572, collimator lenses 573a through 573c, and a beam splitter 574. The KBBF crystal assembly 572 may include a KBBF crystal 572b and two prisms 572a, 572c sandwiching the KBBF crystal 572b. Optical contact may be formed by the KBBF crystal 572b and the two prisms 572a, 572c.

The laser beams L1rr through L3rr outputted from the LBO crystal unit 560 may be collected to different positions of the KBBF crystal 572b by the light collection lenses 571a through 571c. This makes it possible to reduce the generation of light of difference frequency, light of sum frequency and the like with the laser beams L1rr through L3rr as the fundamental harmonic of light.

The laser beams L1 through L3 outputted from the KBBF crystal assembly 572 may be respectively converted to parallel beams by the collimator lenses 573a through 573c. The collimated laser beams L1 through L3 may reflect off the beam splitter 574. The beam splitter 574 may split the laser beams outputted from the KBBF crystal assembly 572 into the fundamental harmonic of light (laser beams L1rr through L3rr) and a fourth harmonic of light (laser beams L1 through L3). The split laser beams L1rr through L3rr may be monitored or absorbed by a dumper or the like.

Figure 26:
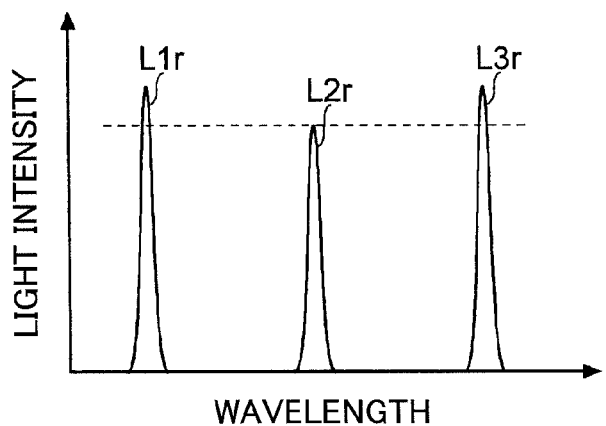
FIG. 26 illustrates another spectrum of laser beams entering an LBO crystal unit according to an embodiment.
Figure 27:
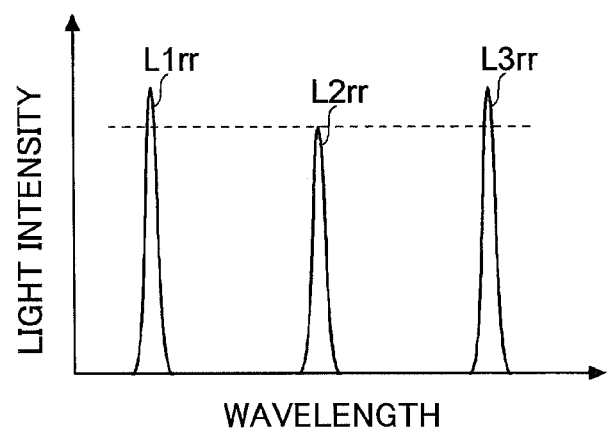
FIG. 27 illustrates another spectrum of laser beams having been outputted from an LBO crystal unit and entering a KBBF crystal unit according to an embodiment.
Figure 28:
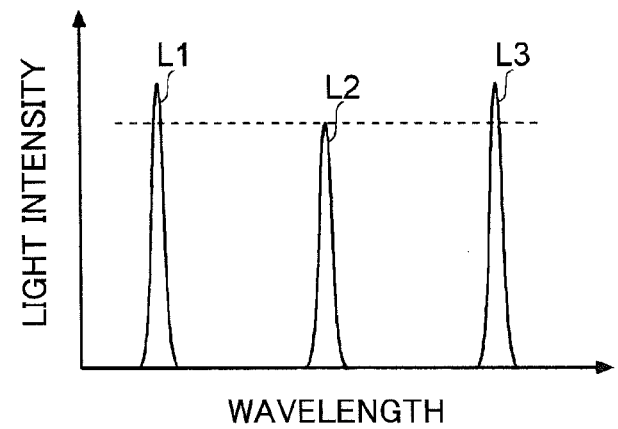
FIG. 28 illustrates another spectrum of laser beams outputted from a KBBF crystal unit according to an embodiment.

Spectra of laser beams that pass through the wavelength converter 550 are illustrated in FIGS. 26 through 28. FIG. 26 illustrates a spectrum of the laser beams L1r through L3r entering the LBO crystal unit 560. FIG. 27 illustrates a spectrum of the laser beams L1rr through L3rr having been outputted from the LBO crystal unit 560 and entering the KBBF crystal unit 570. FIG. 28 illustrates a spectrum of the laser beams L1 through L3 outputted from the KBBF crystal unit 570.

By collecting the laser beams L1r through L3r illustrated in FIG. 26 to different positions of the LBO crystal 562, it is possible to reduce the generation of light of difference frequency, light of sum frequency and the like with the laser beams L1r through L3r as the fundamental harmonic of light, as shown in FIG. 27. Furthermore, by collecting the laser beams L1rr through L3rr illustrated in FIG. 27 to different positions of the KBBF crystal 572b, it is possible to reduce the generation of light of difference frequency, light of sum frequency and the like with the laser beams L1rr through L3rr as the fundamental harmonic of light, as shown in FIG. 28. By reducing the generation of light of difference frequency, light of sum frequency and the like in the manner described above, it is possible to control center wavelengths and peak intensities of the laser beams L1 through L3.

Other constituent elements and operations may be the same as those of the master oscillator system 500 shown in FIG. 19.

Figure 29:
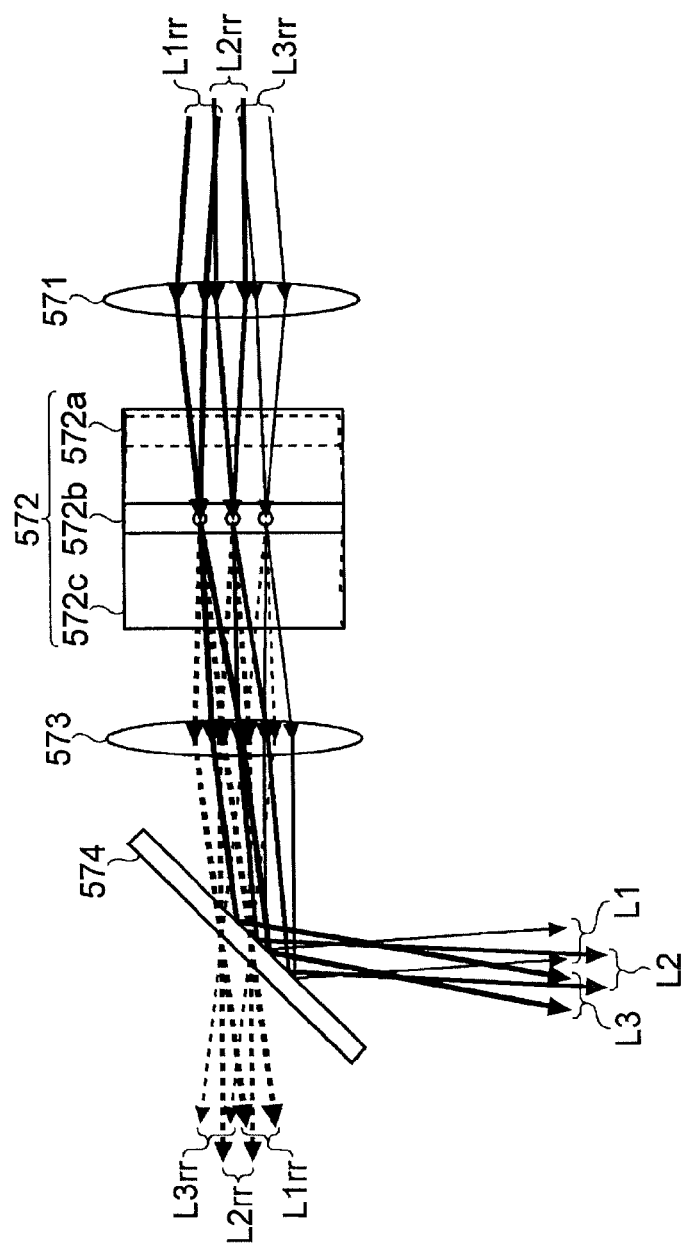
FIG. 29 illustrates another example of a general configuration of the LBO crystal unit shown in FIG. 23.
Figure 30:
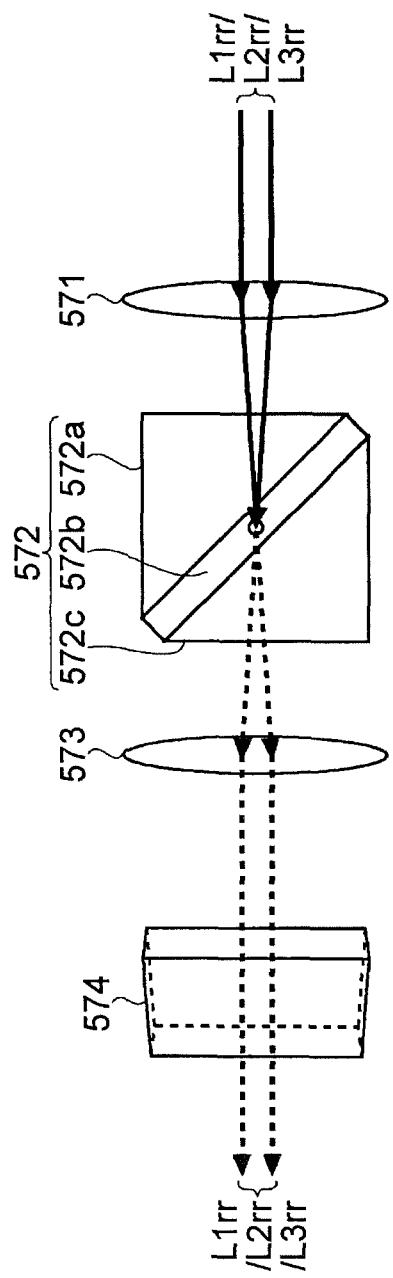
FIG. 30 is a side view of the configuration shown in FIG. 29 when rotated 90 degrees about an optical path of a laser beam as an axis.

5.2.3 System Configuration Example-3 where Plurality of Laser Beams are Spatially Separated The disposition of the KBBF crystal 572b relative to the laser beams L1rr through L3rr shown in FIG. 25 can be changed as is shown in FIGS. 29 and 30. FIG. 30 is a side view of the configuration shown in FIG. 29 when rotated 90 degrees about an optical path of the laser beam L2rr as an axis.

As shown in FIGS. 29 and 30, the disposition of the KBBF crystal 572b relative to the laser beams L1rr through L3rr may be such that the disposition thereof shown in FIG. 25 is rotated 90 degrees about an optical path of the laser beam L2rr as an axis. In this case, because focal points of the laser beams L1rr through L3rr along the optical paths are not required to be changed, the light collection lenses 571a through 571c and the collimator lenses 573a through 573c can be replaced with a single light collection lens 571 and a single collimator lens 573, respectively.

Other constituent elements and operations may be the same as those of the master oscillator system 600 shown in FIG. 23.

Figure 31:
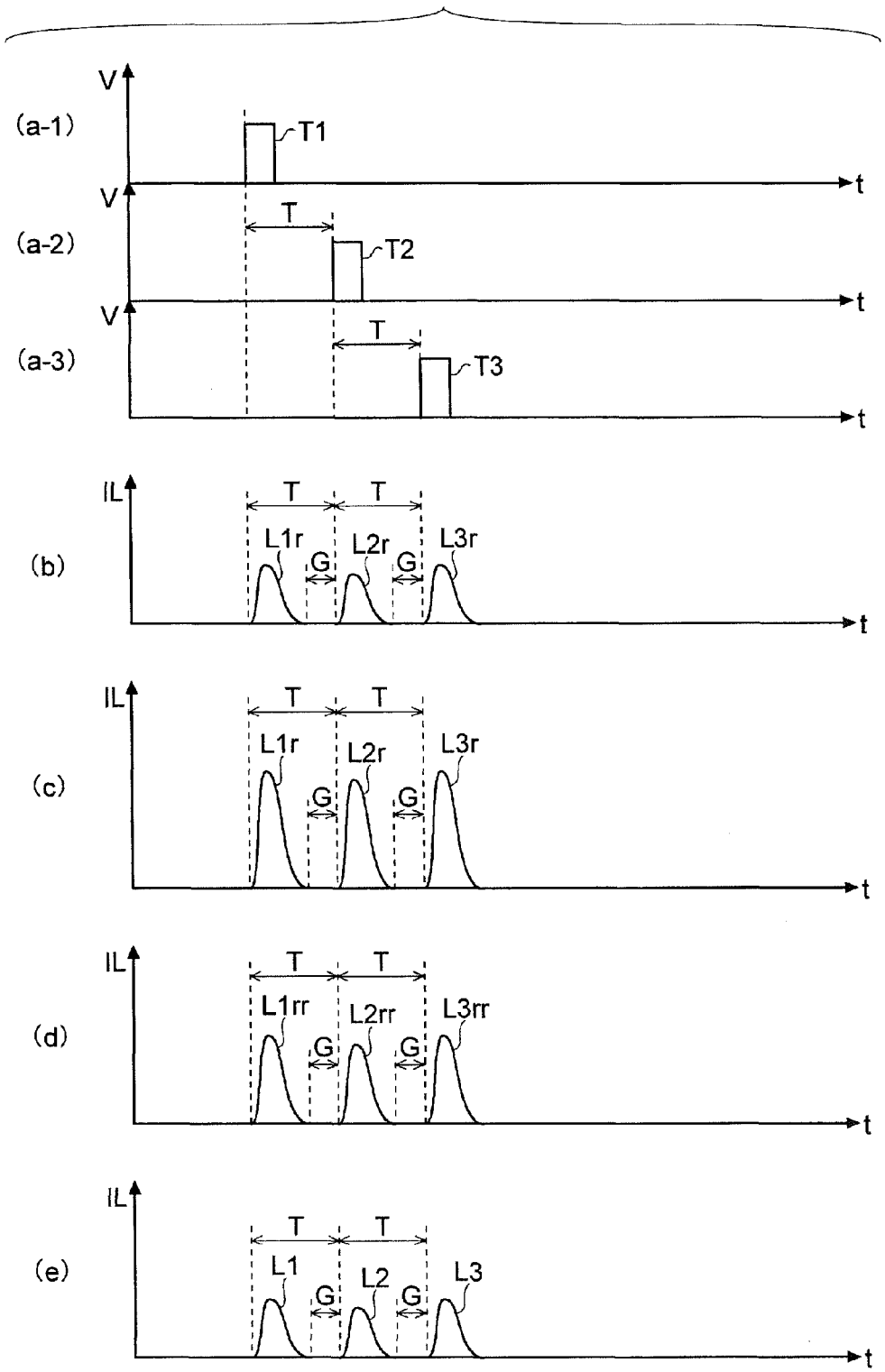
FIG. 31($a$-1) through FIG. 31($e$) illustrate timing charts when laser beams are temporally separated.

5.2.4 System Configuration Example-4 where Plurality of Laser Beams are Temporally Separated In FIG. 19 through FIG. 30, the case in which the laser beams L1, L2 and L3 can be temporally overlapped is exemplified. However, the system configuration is not limited thereto. FIG. 31(a-1) through FIG. 31(e) illustrate timing charts when the laser beams L1 through L3 are temporally separated.

FIGS. 31(a-1) through 31(a-3) illustrate trigger signals T1 through T3 that are respectively supplied to the semiconductor lasers 520a through 520c. The trigger signals T1 through T3 may be shifted from each other by time T which is long enough to temporally separate the laser beams L1, L2 and L3. As a result, as shown in FIG. 31(b), the laser beams L1r through L3r may be outputted from the optical path tuning unit 530 with time difference G therebetween. The time difference G, as shown in FIGS. 31(c) and 31(d), can be present even when the laser beams L1r through L3r pass through the amplifier 540 and the LBO crystal unit 560. As a result, as shown in FIG. 31(e), the laser beams L1, L2 and L3 may be outputted from the KBBF crystal unit 570 with the time difference G therebetween.

Other constituent elements and operations may be the same as those of any one of the system configurations having been described using FIG. 19 through FIG. 30. Note that the aforementioned spatial separation of laser beams and the temporal separation of laser beams may be combined.

5.2.5 System Configuration Example-5 where Part of Each of Plurality of Laser Beams Spatially Overlaps Each Other In FIG. 31(a-1) through FIG. 31(e), the case in which the laser beams L1 through L3 are temporally separated is exemplified. However, the configuration of the system is not limited thereto. For example, part of each of the laser beams L1 through L3 may be spatially overlapped each other.

Figure 32:
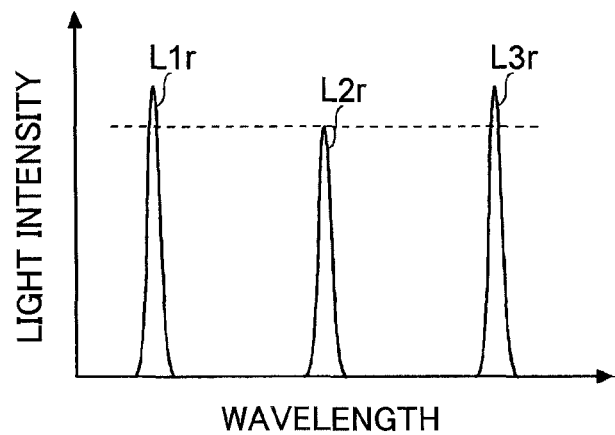
FIG. 32 illustrates another spectrum of laser beams entering an LBO crystal unit according to an embodiment.
Figure 33:
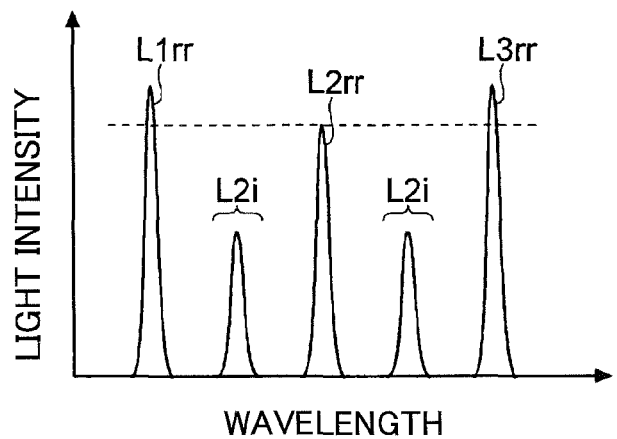
FIG. 33 illustrates another spectrum of laser beams having been outputted from an LBO crystal unit and entering a KBBF crystal unit according to an embodiment.
Figure 34:
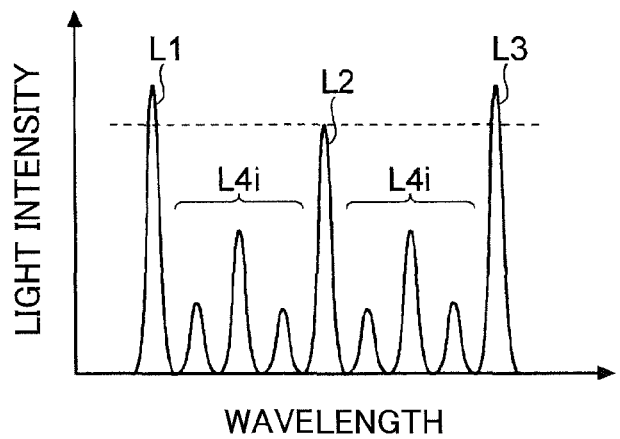
FIG. 34 illustrates another spectrum of laser beams outputted from a KBBF crystal unit according to an embodiment.

In FIGS. 32 through 34, spectra of laser beams that pass through the wavelength converter 550 are illustrated in the case where part of the laser beam L1, part of the laser beam L2 and part of the laser beam L3 are overlapped. FIG. 32 illustrates a spectrum of the laser beams L1r through L3r entering the LBO crystal unit 560. FIG. 33 illustrates a spectrum of the laser beams L1rr through L3rr and a laser beam L2i having been outputted from the LBO crystal unit 560 and entering the KBBF crystal unit 570. FIG. 34 illustrates a spectrum of the laser beams L1 through L3 and a laser beam L4i outputted from the KBBF crystal unit 570.

By collecting the laser beams L1r through L3r shown in FIG. 32 to the LBO crystal 562 so that part of each of those laser beams is overlapped each other, the laser beam L2i, which is formed of difference-frequency light, sum-frequency light and the like, can be outputted in addition to the laser beams L1rr through L3rr as a second harmonic of light, as shown in FIG. 33. Peak intensity of the laser beam L2i may be smaller than those of the other beams L1rr through L3rr. In addition, by collecting the laser beams L1rr through L3rr and L2i (shown in FIG. 33) to the KBBF crystal 572b so that part of each of those laser beams is overlapped each other, the laser beam L4i, which is formed of difference-frequency light, sum-frequency light and the like, can be outputted in addition to the laser beams L1 through L3 as a fourth harmonic of light, as shown in FIG. 34. Peak intensity of the laser beam L4i may be smaller than those of the other laser beams L1 through L3. In this manner, in addition to the laser beams L1, L2 and L3, the laser beam L4i, which is formed of difference-frequency light, sum-frequency light and the like, may be included in a laser beam that is finally outputted by the master oscillator system 20.

Figure 35:
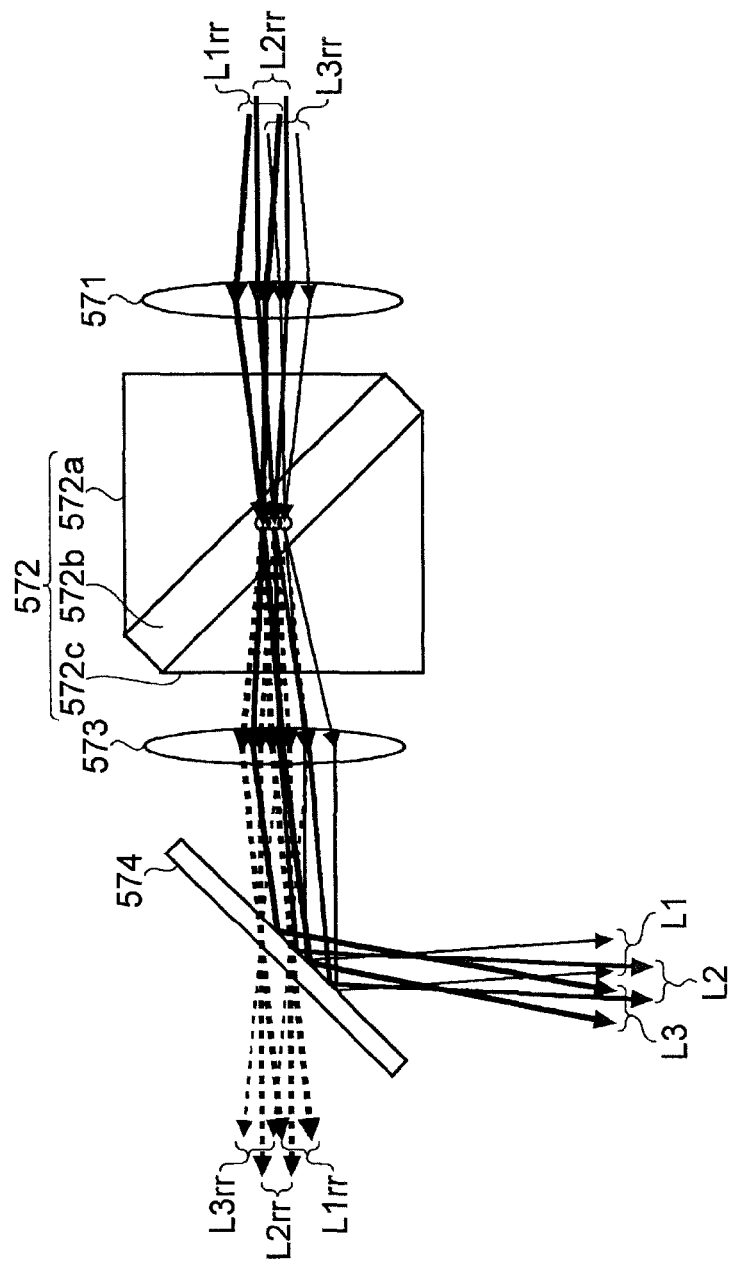
FIG. 35 illustrates an example of a general configuration of a KBBF crystal unit in which part of a laser beam spatially overlaps each other according to an embodiment.

FIG. 35 illustrates a general configuration of the KBBF crystal unit 570 in the case where part of each of the laser beams L1 through L3 spatially overlaps each other. As shown in FIG. 35, in the case where part of each of the laser beams L1 through L3 spatially overlaps each other, part of each of the laser beams L1 through L3 may overlap at the focal points of the laser beams L1rr through L3rr along the optical paths. In this case, the light collection lenses 571a through 571c and the collimator lenses 573a through 573c may be replaced with the single light collection lens 571 and the single collimator lens 573, respectively.

Other constituent elements and operations may be the same as those of any one of the system configurations having been described using FIG. 19 through FIG. 30.

Figure 36:
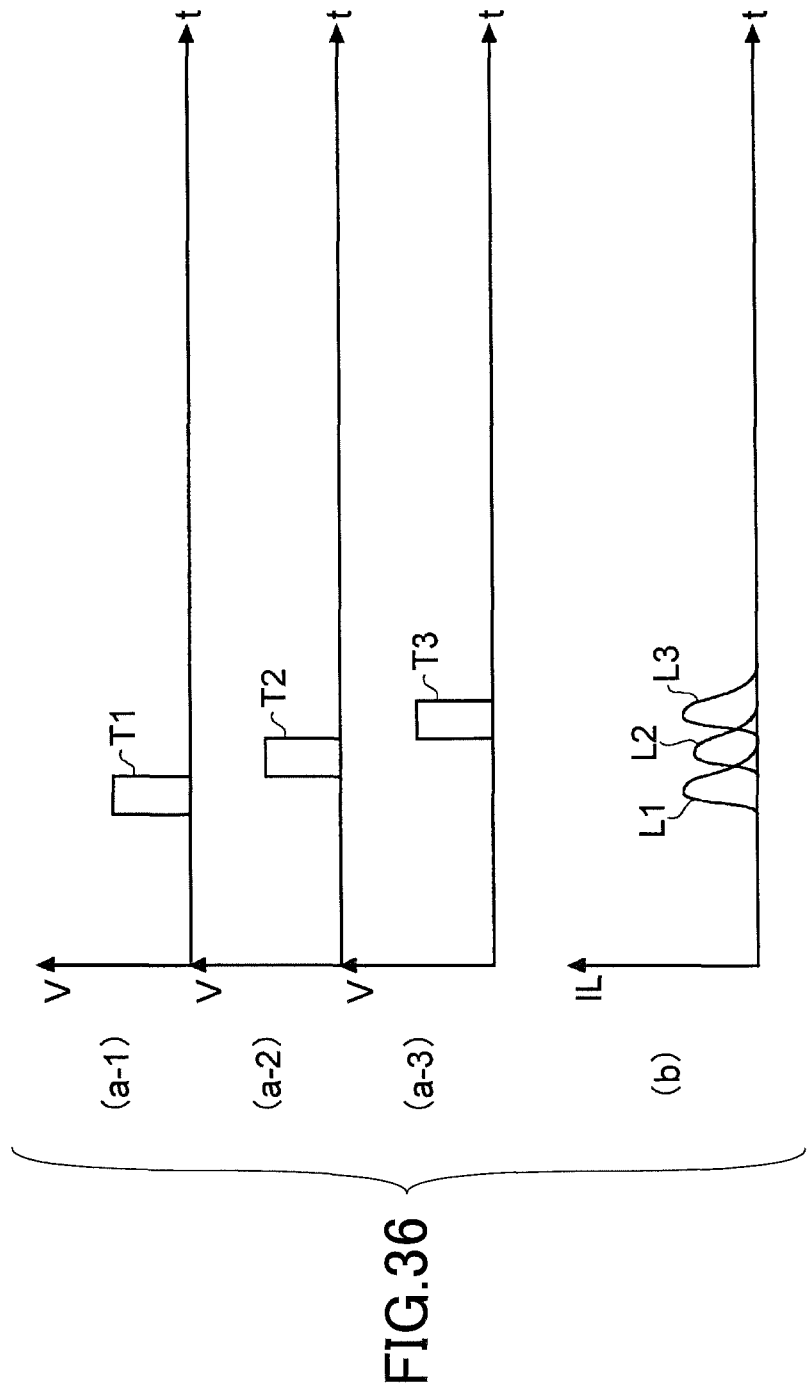
FIG. 36($a$-1) through FIG. 36($b$) illustrate timing charts when part of a laser beam is temporally overlapped each other according to an embodiment.

5.2.6 System Configuration Example-6 where Part of Each of Plurality of Laser Beams Temporally Overlaps Each Other Part of each of the laser beams L1 through L3 may be temporally overlapped each other. In this case, as shown in FIG. 36(a-1) through 36(a-3), the trigger signals T1 through T3 respectively supplied to the semiconductor lasers 520a through 520c may be shifted from each other by time Ts, which is necessarily and sufficiently short. Through this, as shown in FIG. 36(b), the laser beams L1r through L3r may be outputted from the optical path tuning unit 530 so that part of each of the laser beams is temporally overlapped with each other; as a result, the laser beams L1 through L3 can be outputted from the KBBF crystal unit 570 while part of each of the laser beams is being temporally overlapped each other.

Other constituent elements and operations may be the same as those of any one of the system configurations having been described using FIG. 19 through FIG. 30. It is to be noted that spectra of the laser beams that pass through the wavelength converter 550 may be the same as those illustrated in FIGS. 32 through 34.

5.3 Laser Apparatus Equipped with Attenuator

Figure 37:
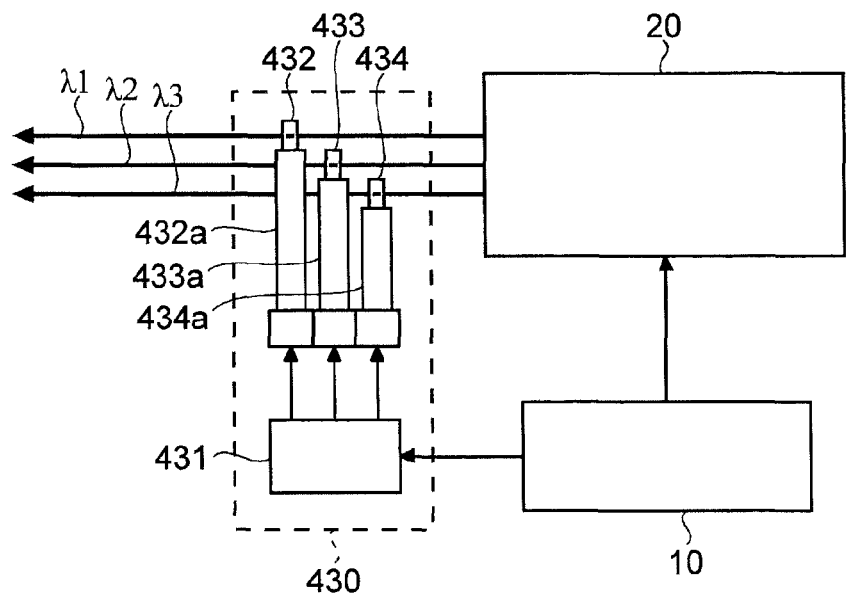
FIG. 37 illustrates a general configuration of an attenuator and a master oscillator system in combination according to an embodiment.
Figure 38:
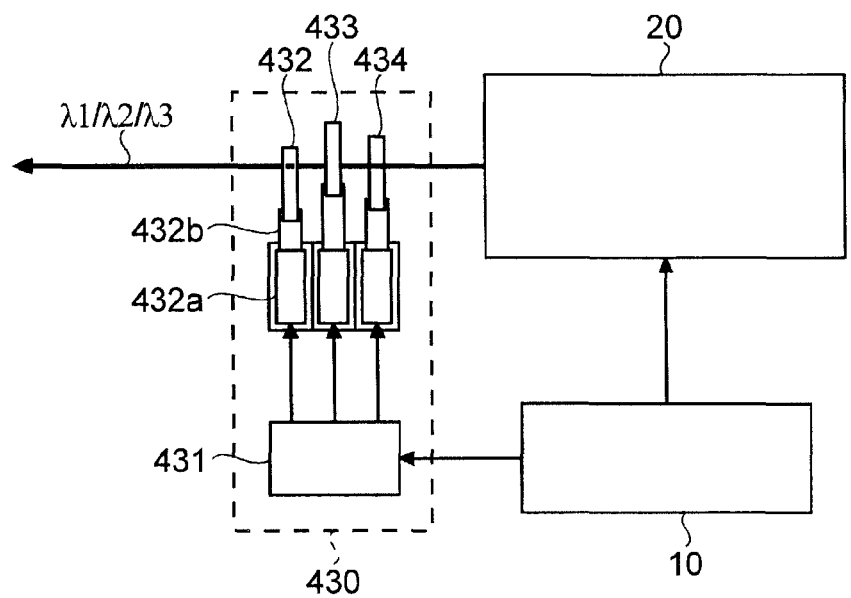
FIG. 38 is a side view of the configuration shown in FIG. 37 when rotated 90 degrees about an optical path of the laser beam as an axis.

Peak intensity of the laser beam L1 outputted by the master oscillator system 20 may be tuned using an attenuator. FIGS. 37 and 38 illustrate a general configuration of an attenuator 430 and the master oscillator system 20 in combination. FIG. 38 is a side view of the configuration shown in FIG. 37 when rotated 90 degrees about an optical path of the laser beam L2r as an axis. Note that, instead of the master oscillator system 20, the another master oscillator system 120 or 220 that has been exemplified in the above description may be used. The attenuator 430 may be part of the master oscillator system 20.

As shown in FIGS. 37 and 38, the attenuator 430 may include a controller 431, attenuation plates 432 through 434, and movement stages 432a through 434a.

Figure 39:
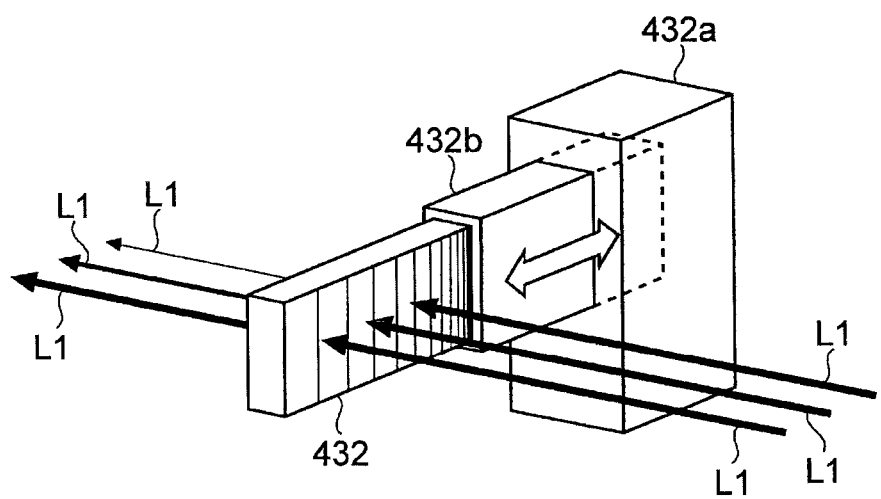
FIG. 39 illustrates an example of an attenuation plate and a movement stage in combination according to an embodiment.
Figure 40:
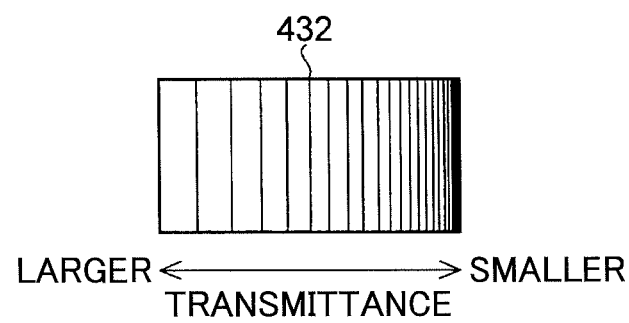
FIG. 40 illustrates an example of an attenuation plate according to an embodiment.

FIG. 39 illustrates an example of the attenuation plate 432 and the movement stage 432a in combination. FIG. 40 illustrates an example of the attenuation plate 432. The movement stage 432a may include an arm unit 432b that can be pushed/pulled in the horizontal direction. The attenuation plate 432 may be attached to a tip of the arm unit 432b. The attenuation plate 432 may be a plate-shaped transparent substrate. A semi-transmissive film whose transmittance varies along the movement direction of the arm unit 432b may be formed on at least one surface of the attenuation plate 432 through which the laser beam L1 passes. With this, transmittance of the attenuation plate 432 may vary along the movement direction of the arm unit 432b. Fundamental and structural relationships between the attenuation plate 433 and the movement stage 433a and between the attenuation plate 434 and the movement stage 434a may be the same as that between the attenuation plate 432 and the movement stage 432a.

The controller 431, upon receiving a command about peak intensity of the laser beam L1 from the controller 10, may drive the movement stages 432a through 434a to insert the attenuation plates 432 through 434 into an optical path of the laser beam L1. With this, peak intensity of the laser beam L1 may be adjusted depending on the positions in the attenuation plates 432 through 434 through which the laser beam L1 passes. Other constituent elements and operations may be the same as those in the earlier description.

6. Amplifying Apparatus

Next, the amplifying apparatus 50 shown in FIG. 1 will be described in detail with reference to the drawings. The amplifying apparatus 50 may be an apparatus such as a power oscillator, a power amplifier, a regenerative amplifier and so on. In addition, the amplifying apparatus 50 may be a single amplifying apparatus itself or may include a plurality of amplifying apparatuses.

6.1 Power Amplifier Including Excimer Gas as Gain Medium

Figure 41:
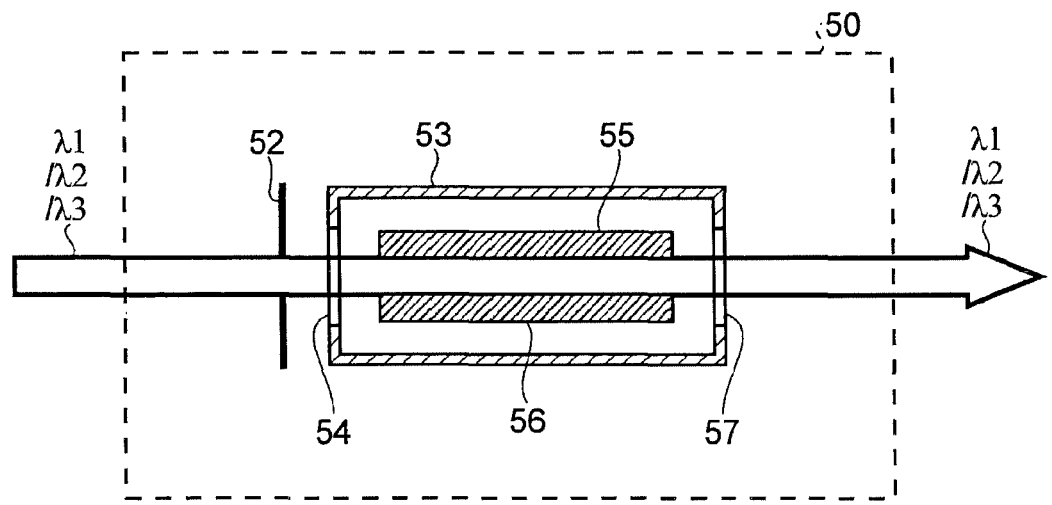
FIG. 41 schematically illustrates a general configuration of an amplifying apparatus configured as a power amplifier according to an embodiment.

FIG. 41 schematically illustrates a general configuration of the amplifying apparatus 50 configured as a power amplifier. As shown in FIG. 41, the amplifying apparatus 50 may include a chamber 53, and may further include a slit 52 for adjusting a beam profile of the laser beam L1. Windows 54 and 57 may be provided in the chamber 53. Windows 54 and 57 may pass the laser beam L1 therethrough while maintaining air tightness of the chamber 53. The interior of the chamber 53 may be filled with a gain medium such as an excimer gas or the like. The gain medium may include at least one of Kr, Ar, $F_2$, Ne, and Xe gases, for example. Further, a pair of discharge electrodes 55, 56 may be provided within the chamber 53. The discharge electrodes 55, 56 may be disposed sandwiching a region (amplification region) through which the laser beam L1 passes. Pulsed high voltage may be applied between the discharge electrodes 55 and 56 from a power supply (not shown). The high voltage may be applied between the discharge electrodes 55 and 56 at the timing when the laser beam L1 passes through the amplification region. When the high voltage is applied between the discharge electrodes 55 and 56, an amplification region including an activated gain medium can be formed between the discharge electrodes 55 and 56. The laser beam L1 can be amplified when passing through this amplification region.

6.2 Power Oscillator Including Excimer Gas as Gain Medium

Next, examples in which a power oscillator is used as the amplifying apparatus 50 will be described below.

6.2.1 Configuration Example-1 Including Fabry-Perot Resonator

Figure 42:
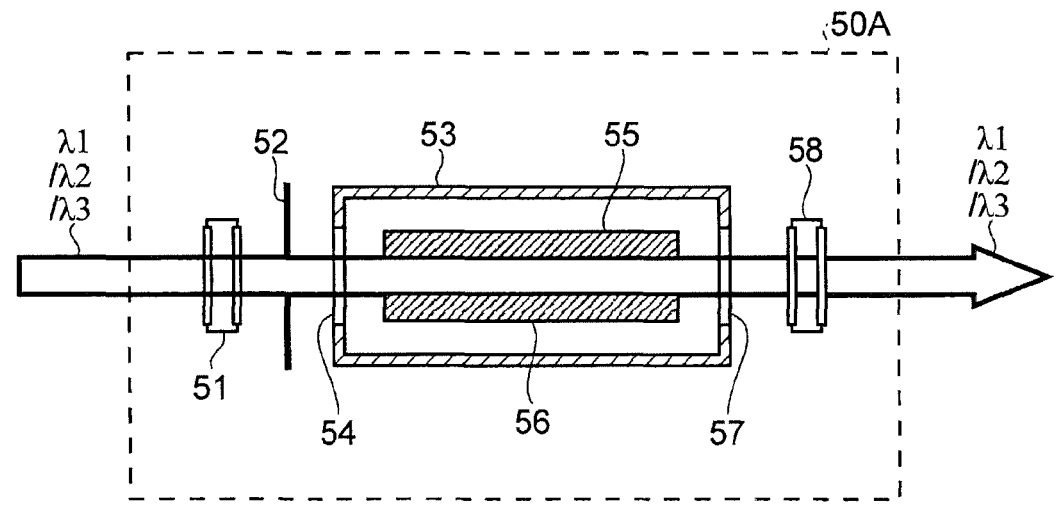
FIG. 42 schematically illustrates a general configuration of an amplifying apparatus using a power oscillator equipped with a Fabry-Perot resonator according to an embodiment.

First, an example of a case in which a power oscillator equipped with a Fabry-Perot resonator is used as the amplifying apparatus 50 is described. FIG. 42 schematically illustrates a general configuration of an amplifying apparatus 50A using a power oscillator equipped with a Fabry-Perot resonator. As shown in FIG. 42, the amplifying apparatus 50A may include a rear mirror 51 that reflects a part of a laser beam and transmits another part of the laser beam and an output coupler 58 that reflects a part of a laser beam and transmits another part of the laser beam, in addition to the same constituent elements as those of the amplifying apparatus 50 shown in FIG. 41. The rear mirror 51 and the output coupler 58 may form an optical resonator. Note that it is preferable for the reflectance of the rear mirror 51 to be higher than that of the output coupler 58. The output coupler 58 may be an output terminal for the laser beam L1 that has been amplified.

6.2.2 Configuration Example-2 Including Ring Resonator

Figure 43:
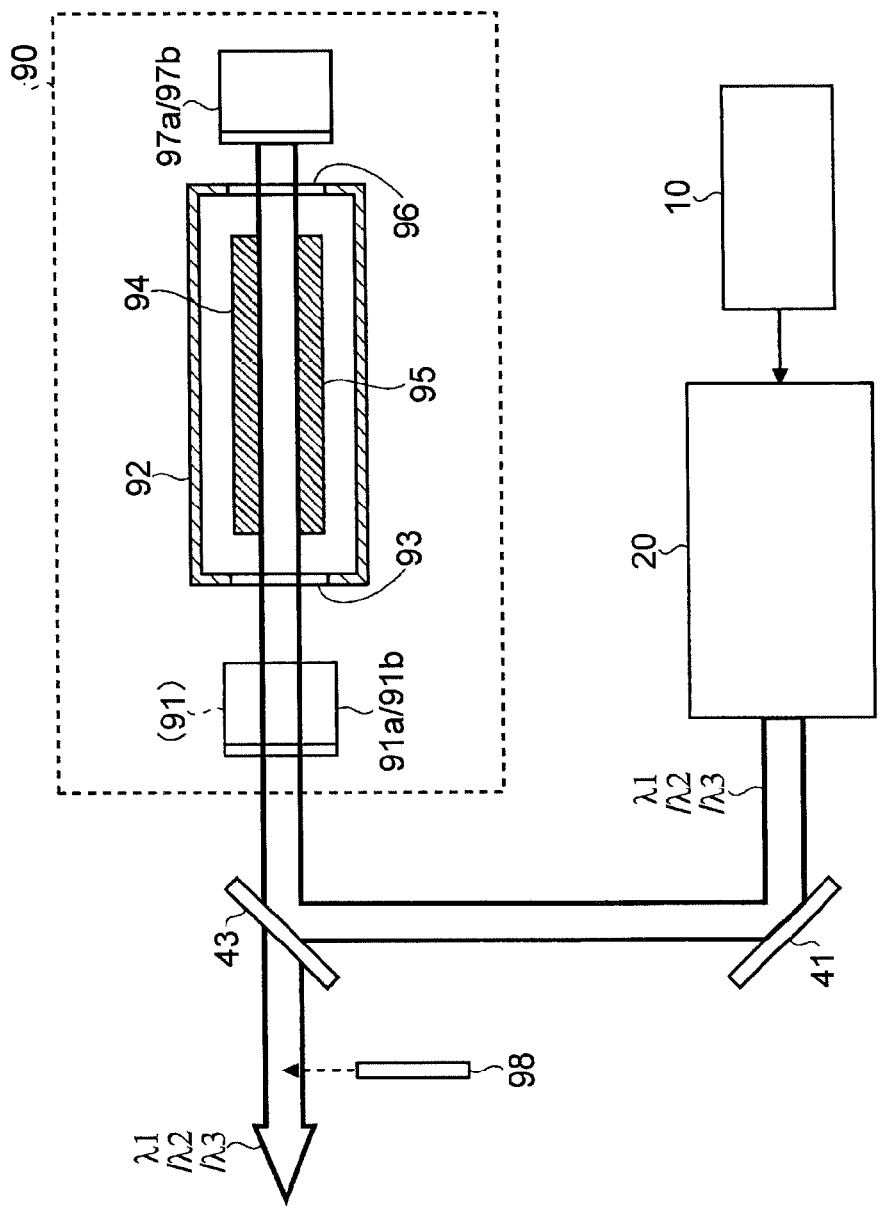
FIG. 43 schematically illustrates a general configuration of an amplifying apparatus using a power oscillator equipped with a ring resonator according to an embodiment.
Figure 44:
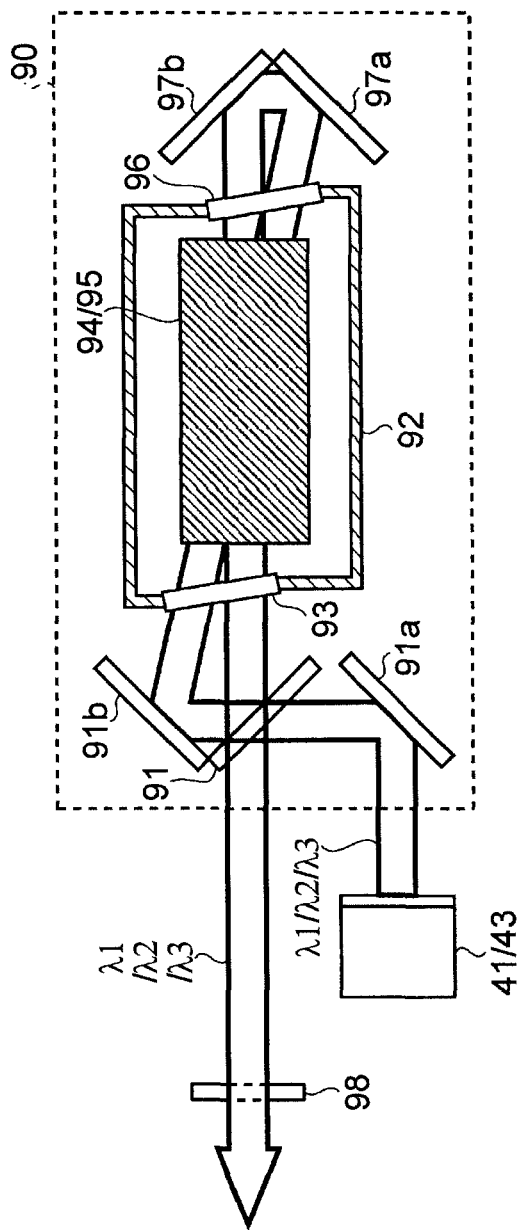
FIG. 44 is a cross-sectional view of the configuration shown in FIG. 43 when rotated 90 degrees about an optical path of the laser beam as an axis.

Next, an example of a case in which a power oscillator equipped with a ring resonator is used as the amplifying apparatus 50 is described. FIG. 43 and FIG. 44 schematically illustrate a general configuration of an amplifying apparatus 90 using a power oscillator equipped with a ring resonator. A shutter 98 that blocks the laser beam L1 outputted from the amplifying apparatus 90 may be further provided at the output stage of the amplifying apparatus 90. Further, a beam splitter 43 may be used instead of the highly reflective mirror 42 shown in FIG. 1.

As shown in FIGS. 43 and 44, the amplifying apparatus 90 may include highly reflective mirrors 91a, 91b, 97a and 97b, an output coupler 91, and a chamber 92. The output coupler 91 and the highly reflective mirrors 91a, 91b, 97a and 97b may form a multi-pass that the laser beam L1 passes through the amplification region within the chamber 92 a plurality of times. The output coupler 91 may be a partial reflection mirror. The chamber 92 may be arranged along an optical path formed by the output coupler 91 and the highly reflective mirrors 91a, 91b, 97a and 97b. Further, the amplifying apparatus 90 may include a slot (not shown) for adjusting a beam profile of the laser beam L1 that travels inside thereof. The interior of the chamber 92 may be filled with a gain medium such as an excimer gas or the like so that the amplification regions is filled with the gain medium. The gain medium may include at least one of Kr, Ar, $F_2$, Ne, and Xe gases, for example.

7. Spectrum Detecting Unit

The spectrum detecting unit 63 shown in FIG. 1 will be described hereinbelow.

7.1 Monitor Etalon Spectroscope

Figure 45:
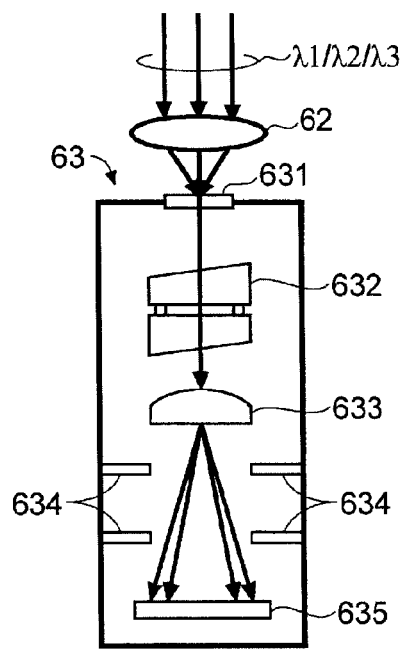
FIG. 45 schematically illustrates a general configuration of a spectrum detecting unit according to an embodiment.

At first, the spectrum detecting unit 63 using a monitor etalon is described in detail with reference to the drawings. FIG. 45 schematically illustrates a general configuration of the spectrum detecting unit 63. As shown in FIG. 45, the spectrum detecting unit 63 may include a diffusing plate 631, a monitor etalon 632, a light collection lens 633, and an image sensor 635 (or photodiode array).

The laser beam L1 having passed through the light collection lens 62 may be incident on the diffusing plate 631 first. The diffusing plate 631 may scatter the incident laser beam L1. The scattered light may enter the monitor etalon 632. The monitor etalon 632 may be an air gap etalon in which two mirrors are bonded sandwiching a spacer therebetween to face each other at a predetermined interval; each mirror is made of a substrate which transmits the laser beam L1 and whose surface is coated with a partial reflection film. The monitor etalon 632 may transmits the scattered light having a predetermined wavelength in the scattered light having entered. The transmitted light may enter the light collection lens 633. The image sensor 635 may be disposed at a focal plane of the light collection lens 633. The transmitted light collected by the light collection lens 633 can generate an interference fringe pattern on the image sensor 635. The image sensor 635 may detect the generated interference fringe pattern. The second power of the radius of the interference fringe can be proportional to the wavelength of the laser beam L1. Therefore, an entire spectrum of the laser beam L1 can be detected from the detected interference fringe pattern. From the detected spectrum, each spectral bandwidth, peak intensity and wavelength may be obtained with an information processing apparatus (not shown) or may be calculated by the controller 10.

Dousers 634 may be provided between the light collection lens 633 and the image sensor 635. This makes it possible to reduce stray light and in turn obtain an interference fringe pattern with high precision.

7.2 Grating Spectroscope

Next, a spectrum detecting unit 63A using a grating spectroscope is described in detail with reference to the drawings.

Figure 46:
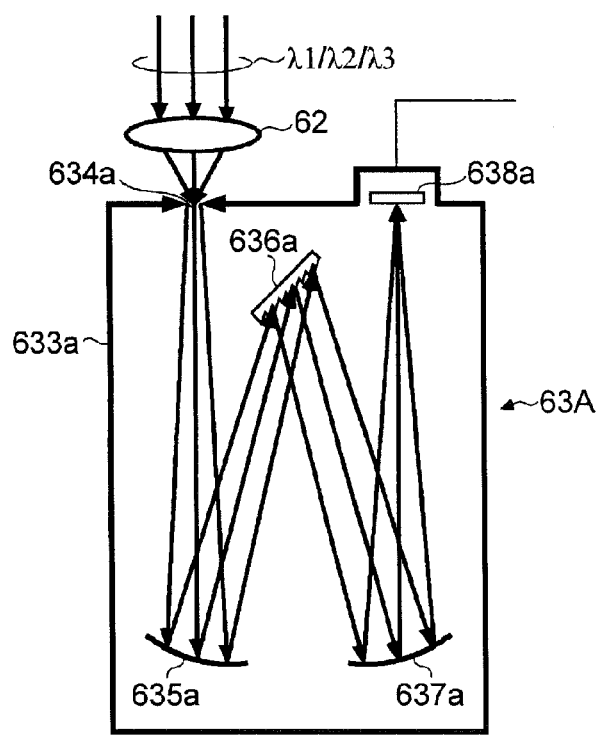
FIG. 46 schematically illustrates another general configuration of a spectrum detecting unit according to an embodiment.

FIG. 46 schematically illustrates a general configuration of the spectrum detecting unit 63A. As shown in FIG. 46, the spectrum detecting unit 63A may include a diffusing plate (not shown) and a spectroscope 633a. The spectroscope 633a may include concave mirrors 635a and 637a, a grating 636a, and an image sensor (line sensor) 638a.

The laser beam L1 may be incident on the diffusing plate first. The diffusing plate may scatter the incident laser beam L1. The scattered light may enter the light collection lens 62. An incidence slit 634a of the spectroscope 633a may be disposed in the vicinity of a focal plane of the light collection lens 62. Note that the incidence slit 634a may be disposed slightly in front of the focal plane of the light collection lens 62. The scattered light collected by the light collection lens 62 may be incident on the concave mirror 635a through the incidence slit 634a. The concave mirror 635a may convert the incident scattered light to collimated light and reflect this collimated light. The reflected light may be incident on the grating 636a. The grating 636a may diffract the incident collimated light. The diffracted light may be incident on the concave mirror 637a. The concave mirror 637a may collect and reflect the incident diffracted light. The image sensor 638a may be disposed at a focal plane of the concave mirror 637a. In this case, the light having been collected and reflected by the concave mirror 637a can form an image on the image sensor 638a. The image sensor 638a may detect distribution of light intensity at a position of each formed image (channel). The position of an image formed by the reflected light can be proportional to the wavelength of the laser beam L1. This makes it possible to detect an entire spectrum of the laser beam L1 from the detected positions of the formed images. From the detected spectrum, each spectral bandwidth, peak intensity, and wavelength may be obtained with an information processing apparatus (not shown) or may be calculated by the controller 10.

8. Optical Path Tuning Unit

Hereinafter, examples of the aforementioned optical path tuning unit 530 will be described.

8.1 Configuration for Making Optical Paths Coincide

First, the followings are examples of the optical path tuning unit 530 in which optical paths of the laser beams L1r through L3r outputted from the semiconductor lasers 520a through 520c are made to substantially coincide with each other.

8.1.1 Optical Path Tuning Unit Including Half Mirror

Figure 47:
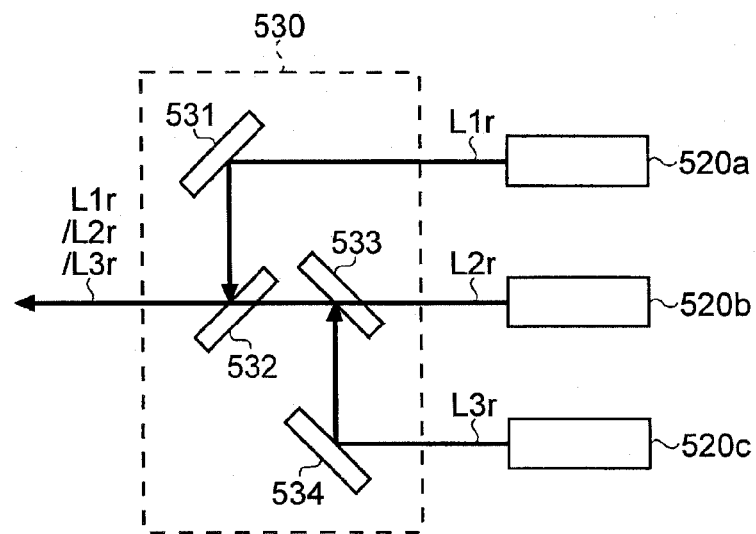
FIG. 47 schematically illustrates a general configuration of an optical path tuning unit using a half mirror according to an embodiment.

FIG. 47 schematically illustrates a general configuration of the optical path tuning unit 530 using half mirrors. In the configuration shown in FIG. 47, the laser beam L2r outputted from the semiconductor laser 520b may pass through half mirrors 533 and 532. The laser beam L1r outputted from the semiconductor laser 520a may reflect off a highly reflective mirror 531 and then reflect off the half mirror 532. Through this, optical paths of the laser beams L1r and L2r can substantially coincide with each other. The laser beam L3r outputted from the semiconductor laser 520c may reflect off a highly reflective mirror 534, reflect off the half mirror 533, and then pass through the half mirror 532. Thus, the optical paths of the laser beams L1r through L3r can substantially coincide with each other.

8.1.2 Optical Path Tuning Unit Including Grating

Figure 48:
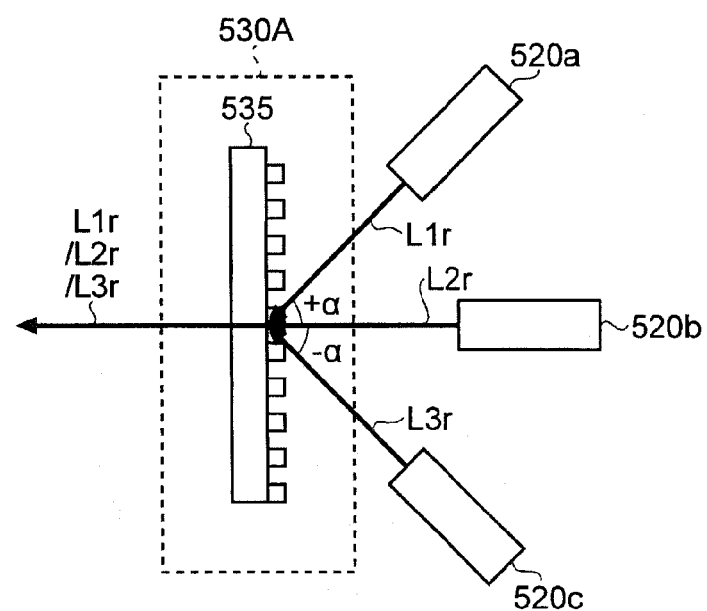
FIG. 48 illustrates an example of an optical path tuning unit using a grating according to an embodiment.

Next, an optical path tuning unit 530A using a grating 535 will be described in detail with reference to the drawings. FIG. 48 illustrates an example of the optical path tuning unit 530A using the grating 535. As shown in FIG. 48, the laser beam L2r may be incident on the grating 535 from a direction orthogonal thereto, for example. The laser beam L1r may be incident on the grating 535 being tilted relative to the laser beam L2r by an angle of +α, for example. Further, the laser beam L3r may be incident on the grating 535 being tilted relative to the laser beam L2r by an angle of −α, for example. The angles of ±α may be set so that, for example, optical paths of positive first-order diffracted light and negative first-order diffracted light of the laser beams L1r and L3r substantially coincide with an optical path of zero-order diffracted light of the laser beam L2r (transmitted light). Through this, using the grating 535 can make the optical paths of the laser beams L1r through L3r substantially coincide with each other. Although the grating 535 of transmissive type is employed in FIG. 48, a grating of reflection type may be employed instead.

8.2 Configuration for Making Optical Paths be Skewed

Examples of the optical path tuning unit 530B and 530C are described below in which optical paths of the laser beams L1r through L3r respectively outputted from the semiconductor lasers 520a through 520c are made to approximately coincide with each other while being slightly skewed.

8.2.1 Optical Path Tuning Unit Including Half Mirror

Figure 49:
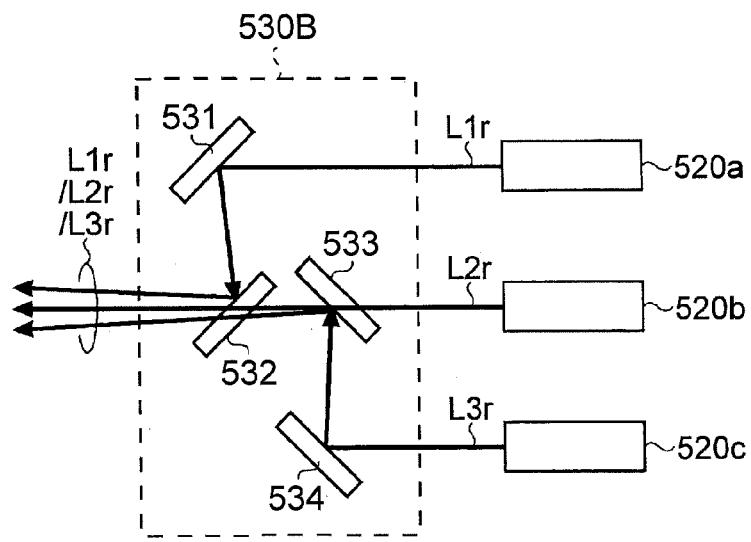
FIG. 49 schematically illustrates another general configuration of an optical path tuning unit using a half mirror according to an embodiment.

FIG. 49 schematically illustrates a general configuration of the optical path tuning unit 530B using half mirrors. In the configuration shown in FIG. 49, the laser beam L2r outputted from the semiconductor laser 520b may pass through half mirrors 533 and 532. The laser beam L1r outputted from the semiconductor laser 520a may reflect off a highly reflective mirror 531 and then reflect off the half mirror 532. The half mirror 532 may be slightly tilted relative to the highly reflective mirror 531. With this, optical paths of the laser beams L1r and L2r are made to approximately coincide while being slightly skewed relative to each other. The laser beam L3r outputted from the semiconductor laser 520c may reflect off a highly reflective mirror 534, reflect off the half mirror 533, and then pass through the half mirror 532. The half mirror 533 may be slightly tilted relative to the highly reflective mirror 534. With this, the optical paths of the laser beams L1r through L3r can be made to approximately coincide with each other while being slightly skewed relative to each other.

8.2.2 Optical Path Tuning Unit Including Grating

Figure 50:
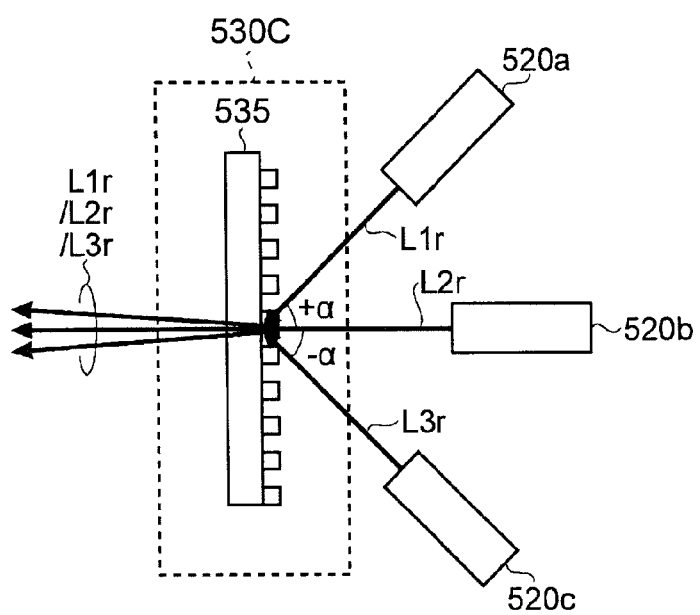
FIG. 50 illustrates another example of an optical path tuning unit using a grating according to an embodiment.

Next, an optical path tuning unit 530C using a grating 535 is described in detail below with reference to the drawings. FIG. 50 illustrates an example of the optical path tuning unit 530C using the grating 535. As shown in FIG. 50, the laser beam L2r may be incident on the grating 535 from a direction orthogonal thereto, for example. The laser beam L1r may be incident on the grating 635 being tilted relative to the laser beam L2r by an angle of +α, for example. Further, the laser beam L3r may be incident on the grating 535 being tilted relative to the laser beam L2r by an angle of −α, for example. The angles of ±α may be set so that angles of optical paths of diffracted light of the laser beams L1r and L3r are slightly skewed relative to the angle of an optical path of zero-order diffracted light of the laser beam L2r (transmitted light). Through this, using the grating 535 can make the angles of optical paths of the laser beams L1r through L3r be slightly skewed relative to each other. Although the grating 535 of transmissive type is employed in FIG. 50, a grating of reflection type may be employed instead.

9. Titanium-Sapphire Amplifier

The amplifier 540 in the master oscillator system 500 or 600 will be described. Note that an example of the amplifier 540 using a titanium-sapphire crystal as a gain medium is described hereinafter.

9.1 Regenerative Amplifier

Figure 51:
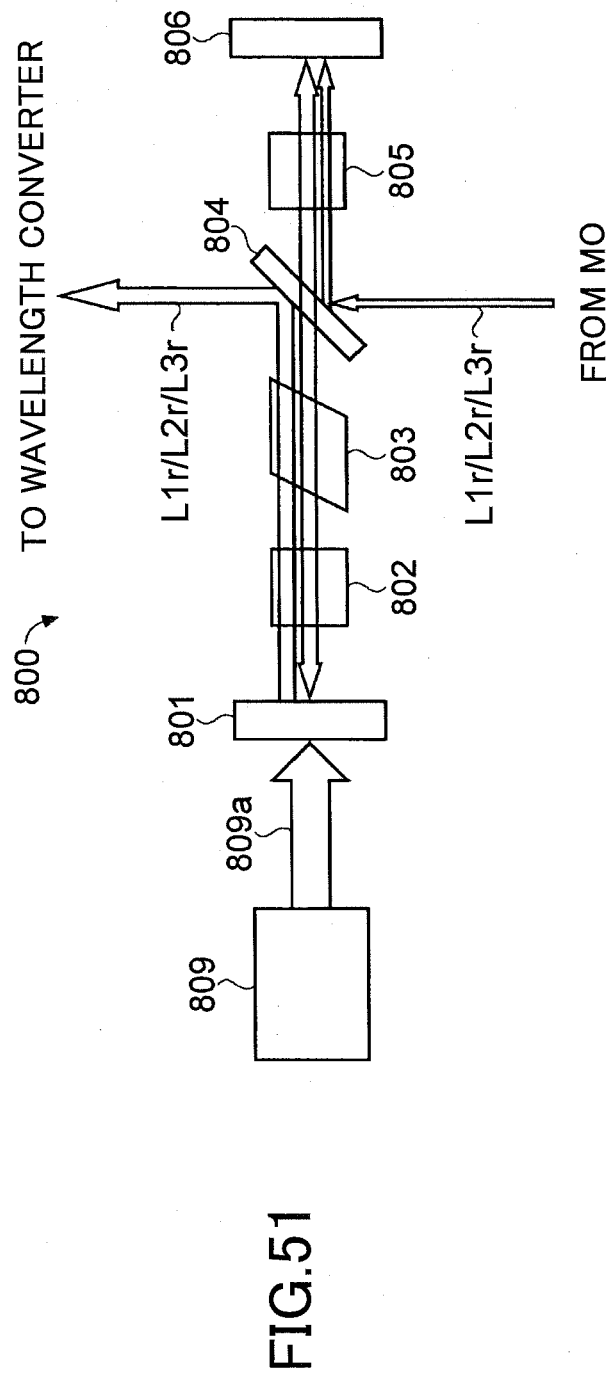
FIG. 51 schematically illustrates a general configuration of a regenerative amplifier according to an embodiment.

A regenerative amplifier 800 may be used as the amplifier 540. FIG. 51 schematically illustrates a general configuration of the regenerative amplifier 800. As shown in FIG. 51, the regenerative amplifier 800 may include highly reflective mirrors 801 and 806, Pockels cells 802 and 805, a titanium-sapphire crystal 803 as a gain medium, a polarizing beam splitter 804, and a pumping laser 809.

The highly reflective mirrors 801 and 806 may form an optical resonator. The Pockels cell 802, the titanium-sapphire crystal 803, the polarizing beam splitter 804, and the Pockels cell 805 may be disposed on an optical path in the optical resonator formed by the highly reflective mirrors 801 and 806. The Pockels cells 802 and 805 may function as a λ/4 plate during voltage being applied thereto, for example. The pumping laser 809 may supply excitation light 809a to the titanium-sapphire crystal 803.

9.2 Multi-Pass Amplifier

Figure 52:
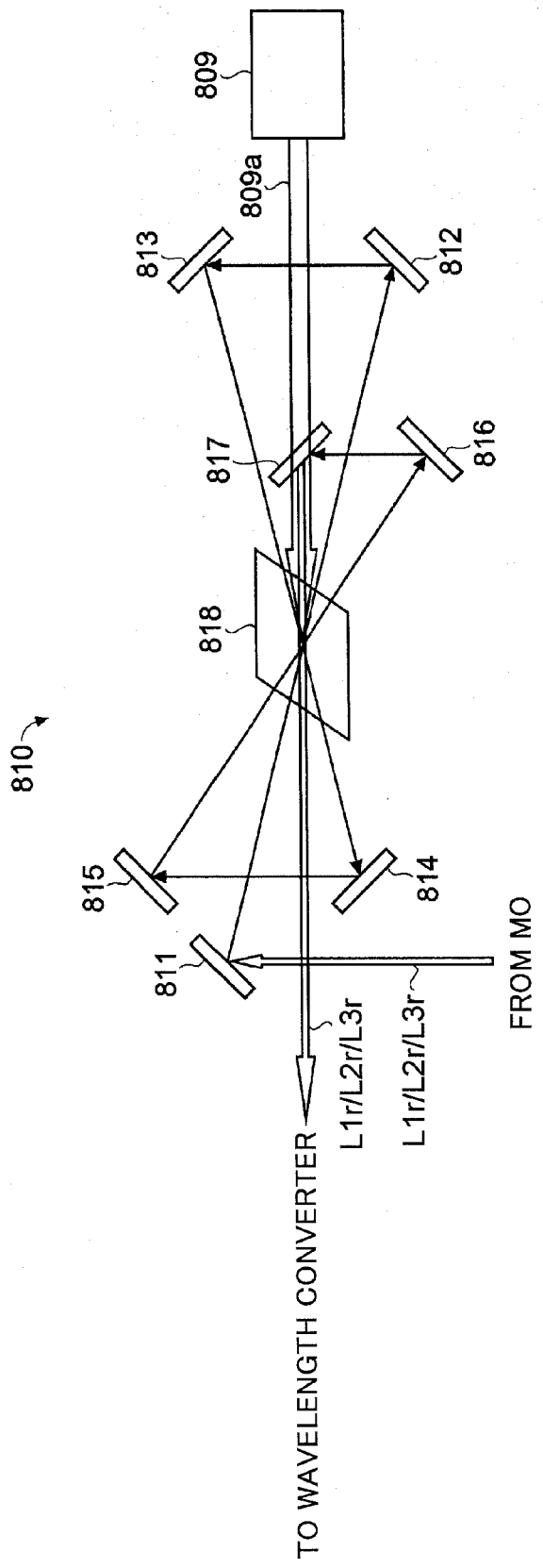
FIG. 52 schematically illustrates a general configuration of an amplifier configured as a multi-pass power amplifier according to an embodiment.

The amplifier 540 may be a multi-pass power amplifier. FIG. 52 schematically illustrates a general configuration of an amplifier 810 configured as a multi-pass power amplifier. As shown in FIG. 52, the amplifier 810 may include a plurality of highly reflective mirrors 811 through 817, a titanium-sapphire crystal 818 as a gain medium, and the pumping laser 809.

The plurality of highly reflective mirrors 811 through 817 may form a multi-pass where the laser beams L1r through L3r having been inputted from the master oscillator system 20 pass through the titanium-sapphire crystal 818 a plurality of times (4 times in the present example), for example. The excitation light 809a from the pumping laser 809 may enter the titanium-sapphire crystal 818 via the highly reflective mirror 817. In other words, the highly reflective mirror 817 may transmit the excitation light 809a and reflect the laser beams L1r through L3r from the titanium-sapphire crystal 818. In this case, the laser beams L1r through L3r can experience multi-pass amplification when passing through the titanium-sapphire crystal 818 the plurality of times.

9.3 Power Oscillator 9.3.1 Fabry-Perot Power Oscillator

Figure 53:
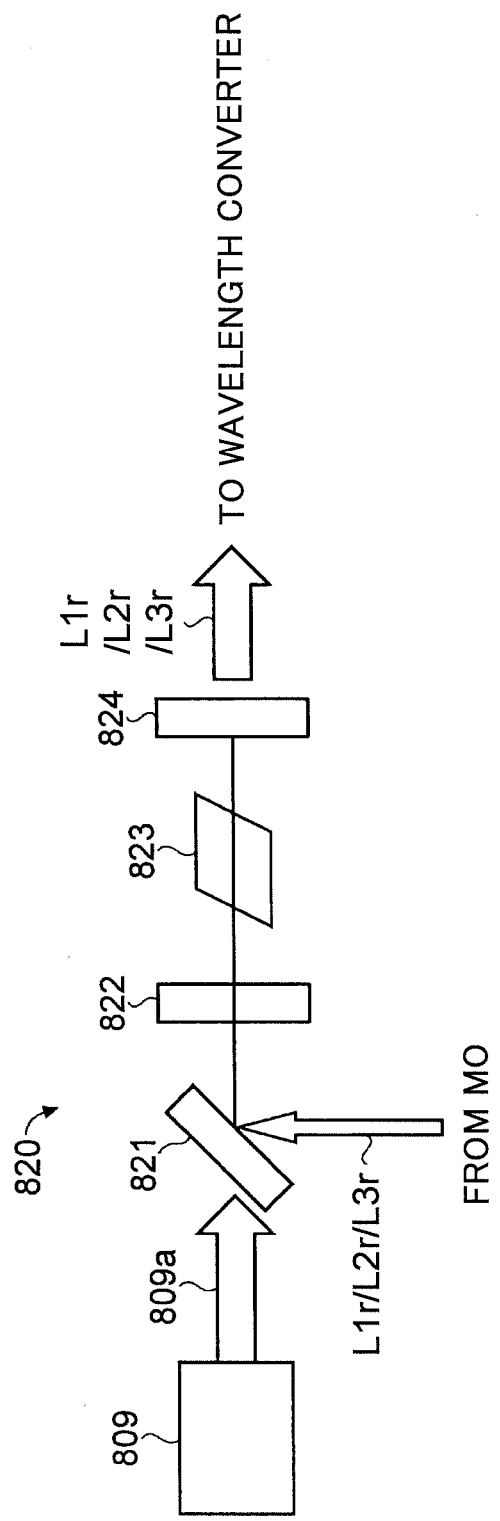
FIG. 53 schematically illustrates a general configuration of an amplifier configured as a Fabry-Perot power oscillator according to an embodiment.

The amplifier 540 may be a Fabry-Perot power oscillator. FIG. 53 schematically illustrates a general configuration of an amplifier 820 configured as a Fabry-Perot power oscillator. As shown in FIG. 53, the amplifier 820 may include a partial reflection mirror 822, an output coupler 824, a titanium-sapphire crystal 823 as a gain medium, a highly reflective mirror 821, and the pumping laser 809.

The partial reflection mirror 822 and the output coupler 824 may form an optical resonator. The titanium-sapphire crystal 823 may be disposed on an optical path in the optical resonator formed by the partial reflection mirror 822 and the output coupler 824. The highly reflective mirror 821 may guide the laser beams L1r through L3r entering from the master oscillator system 20 and the excitation light 809a entering from the pumping laser 809 into the optical resonator.

9.3.2 Ring Power Oscillator

Figure 54:
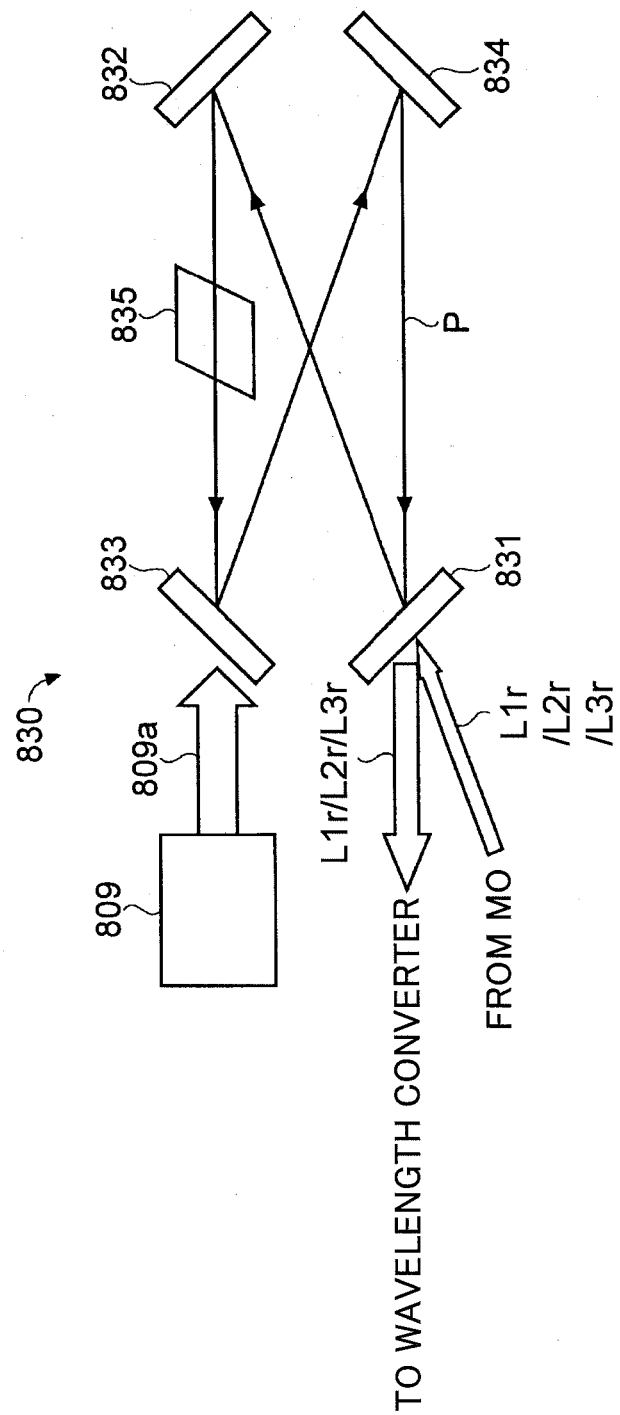
FIG. 54 schematically illustrates a general configuration of an amplifier configured as a ring power oscillator according to an embodiment.

The amplifier 540 may be a ring power oscillator. FIG. 54 schematically illustrates a general configuration of an amplifier 830 configured as a ring power oscillator. As shown in FIG. 54, the amplifier 830 may include an input/output coupler 831, highly reflective mirrors 832 through 834, a titanium-sapphire crystal 835 as a gain medium, and the pumping laser 809.

The input/output coupler 831 and the highly reflective mirrors 832 through 834 may form an optical resonator including a ring-formed optical path P. The titanium-sapphire crystal 835 may be disposed on the optical path P in the optical resonator formed by the input/output coupler 831 and the highly reflective mirrors 832 through 834.

The description above is not intended to limit, but only to provide examples. It is clear for those skilled in the art that various changes and modifications can be made on the embodiments of this disclosure without departing from the spirit and scope of the appended claims.

In the above description, peak intensity in a spectral waveform of each laser beam is controlled. However, it is to be noted that the present invention is not limited thereto. For example, the present invention may have a configuration in which energy of each laser beam represented by an area value, an integration value or the like of the spectral waveform is controlled. In this configuration, a constituent element capable of controlling a spectral bandwidth of each laser beam may be included. Further, in the case where the spectral bandwidth does not change in response to change in energy, for example, a configuration in which peak intensity is controlled may be employed instead of energy in the manner described above.

The terms used in this specification and the appended claims should be construed as non-limiting. For example, the terms "comprise" and "include" should be construed as "include but not be limited to". The term "have" should be construed as "have but not be limited to". An indefinite article "a/an" used in this specification and the appended claims should be construed as "at least one" or "one or more".

In the aforementioned embodiments, examples in which a single amplifier 540 is used are described. However, a plurality of amplifiers 540 may be used. Further, the wavelength converter 550 is not limited to the configurations in the embodiments of the present disclosure, and may be such a converter that converts light entering the wavelength converter 550 to light having a wavelength within an amplification wavelength band of the amplifying apparatus 50, that is, a wavelength of approximately 193 nm, for example. As a nonlinear optical crystal included in the wavelength converter 550, a CLBO crystal may be used in place of the LBO crystal, for example.

What is claimed is:

1. A laser apparatus comprising:
   a master oscillator capable of outputting a laser beam having a spectrum that includes at least three wavelength peaks;
   an amplifying apparatus for amplifying the laser beam having the spectrum that includes at least three wavelength peaks,
   a multi-wavelength oscillation control mechanism capable of controlling energy of each of the wavelength peaks;
   a spectrum detecting unit that detects the spectrum of the laser beam; and
   a controller that controls the multi-wavelength oscillation control mechanism based on a detection result detected by the spectrum detecting unit,
   wherein in the laser beam having the spectrum that includes at least three amplified wavelength peaks, energy of a wavelength peak of the shortest wavelength and energy of a wavelength peak of the longest wavelength are greater than energy of the other amplified wavelength peaks.

2. The laser apparatus according to claim 1,
   wherein the spectrum detecting unit detects the spectrum including at least three amplified wavelength peaks, and
   the controller controls the multi-wavelength oscillation control mechanism so that, among the three amplified wavelength peaks at the least, energy of a wavelength peak of the shortest wavelength and energy of a wavelength peak of the longest wavelength are greater than energy of the other amplified wavelength peaks.

3. The laser apparatus according to claim 1, wherein the multi-wavelength oscillation control mechanism controls at least one of peak intensity and a spectral bandwidth of each wavelength peak.

4. The laser apparatus according to claim 1,
   wherein the master oscillator includes: an output coupler placed at one end of a resonator; a grating placed at the other end of the resonator; and a chamber that includes a laser medium inside thereof and is disposed within the resonator, and
   the multi-wave oscillation control mechanism includes: at least one optical element capable of changing an incidence angle of a laser beam including at least one wavelength peak from among the three wavelength peaks at the least to the grating; and a movement mechanism that pushes/pulls the one optical element at the least to/from an optical path of the laser beam including at least one wavelength peak.

5. The laser apparatus according to claim 4,
   wherein the master oscillator further includes a prism that is disposed within the resonator and separates an incident optical path of the laser beam including at least three wavelength peaks to the grating, and
   the movement mechanism pushes/pulls the one optical element at the least to/from the separated incident optical path.

6. The laser apparatus according to claim 1,
   wherein the multi-wavelength oscillation control mechanism can control a center wavelength of each wavelength peak of the laser beam having the spectrum of at least three wavelength peaks.

7. The laser apparatus according to claim 6,
   wherein the master oscillator includes: an output coupling minor placed at one end of a resonator; a grating placed at the other end of the resonator; and a chamber that includes a laser medium inside thereof and is placed within the resonator, and
   the multi-wave oscillation control mechanism further includes: at least one optical element that is placed on an incident optical path of a laser beam including at least one wavelength peak from among the three wavelength peaks at the least to the grating, and is capable of changing an incidence angle of the laser beam including at least one wavelength peak to the grating; and a rotational mechanism that can rotate the one optical element at the least about an axis other than the incident optical path as a rotational axis.

8. The laser apparatus according to claim 7,
   wherein the master oscillator is disposed within the resonator and further includes a prism that separates an incident optical path of the laser beam including at least three wavelength peaks to the grating, and
   the one optical element at the least is placed on the separated incident optical path.

9. The laser apparatus according to claim 7, wherein the optical element is a wedge prism.

10. The laser apparatus according to claim 6,
    wherein the master oscillator includes: an output coupling minor placed at one end of a resonator; a grating placed at the other end of the resonator; and a chamber that includes a laser medium inside thereof and is placed within the resonator, and
    the multi-wavelength oscillation control mechanism includes: at least one optical element capable of changing an incidence angle of a laser beam including at least one wavelength peak from among the laser beam including at least three wavelength peaks to the grating; and a movement mechanism that pushes/pulls the one optical element at the least to/from an optical path of the laser beam including at least one wavelength peak.

11. The laser apparatus according to claim 10,
wherein the master oscillator is disposed within the resonator and further includes a prism that separates an incident optical path of the laser beam including at least three wavelength peaks to the grating, and
the movement mechanism pushes/pulls the one optical element at the least to/from the separated incident optical path.

12. The laser apparatus according to claim 10, wherein the optical element is a cylindrical lens.

13. The laser apparatus according to claim 1,
wherein laser optical paths each including respective wavelength peaks of the laser beam having the spectrum that includes at least three wavelength peaks, are different from each other,
the multi-wavelength oscillation control mechanism is disposed on an optical path of a laser beam including at least one wavelength peak of the laser beam including the three wavelength peaks at the least, and includes: at least one attenuator that attenuates energy of the laser beam including at least one wavelength peak; and a movement mechanism that moves the one attenuator at the least in a direction perpendicular to the optical path of the laser beam including at least one wavelength peak, and
transmittance of the attenuator varies depending on a position thereof.

14. A laser apparatus comprising:
a master oscillator capable of outputting at least three laser beams each having a different wavelength;
a spectrum detecting unit that detects spectra of the laser beams; and
a controller that controls the master oscillator based on a detection result detected by the spectrum detecting unit,
wherein the master oscillator includes: at least three semiconductor lasers each capable of oscillating at a different wavelength; an optical path adjustment unit that causes optical paths of the three laser beams at the least outputted from the three semiconductor lasers at the least to substantially coincide with each other; and an oscillation controller that controls the three semiconductor lasers at the least.

15. The laser apparatus according to claim 14, further comprising:
an amplifier that amplifies the three laser beams at the least; and
a wavelength converter that converts wavelengths of the three laser beams at the least having been amplified.

16. The laser apparatus according to claim 14, wherein the wavelength converter includes at least one nonlinear optical crystal.

17. The laser apparatus according to claim 16, wherein the nonlinear optical crystal includes at least one of an LBO crystal and a KBBF crystal.

18. The laser apparatus according to claim 16, wherein the wavelength converter further includes at least one light collection lens that collects the three laser beams at the least to the substantially same region in the nonlinear optical crystal.

19. The laser apparatus according to claim 16, wherein the wavelength converter further includes at least one light collection lens that collects the three laser beams at the least to different regions in the nonlinear optical crystal.

20. The laser apparatus according to claim 16, wherein the wavelength converter further includes at least one light collection lens that collects the three laser beams at the least to a region in the nonlinear optical crystal where part of each of the laser beams overlaps each other.

21. The laser apparatus according to claim 14, wherein the oscillation controller causes the three semiconductor lasers at the least to oscillate at substantially the same timing.

22. The laser apparatus according to claim 14, wherein the oscillation controller causes the three semiconductor lasers at the least to oscillate respectively at temporally separated timings.

23. The laser apparatus according to claim 14, wherein the oscillation controller causes the three semiconductor lasers at the least to oscillate respectively at timings in which part of the semiconductor laser beam temporally overlaps each other.

* * * * *